United States Patent
Jao et al.

(10) Patent No.: US 12,349,409 B2
(45) Date of Patent: Jul. 1, 2025

(54) SEMICONDUCTOR DEVICE HAVING A GATE CONTACT ON A LOW-K LINER

(71) Applicant: Taiwan Semiconductor Manufacturing Co., Ltd., Hsinchu (TW)

(72) Inventors: Meng-Huan Jao, Hsinchu (TW); Huan-Chieh Su, Hsinchu (TW); Yi-Bo Liao, Hsinchu (TW); Cheng-Chi Chuang, Hsinchu (TW); Jin Cai, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 494 days.

(21) Appl. No.: 17/695,605

(22) Filed: Mar. 15, 2022

(65) Prior Publication Data
US 2023/0039440 A1 Feb. 9, 2023

Related U.S. Application Data

(60) Provisional application No. 63/230,511, filed on Aug. 6, 2021.

(51) Int. Cl.
| | |
|---|---|
| *H10D 30/00* | (2025.01) |
| *H10D 30/67* | (2025.01) |
| *H10D 62/10* | (2025.01) |
| *H10D 62/83* | (2025.01) |
| *H10D 64/01* | (2025.01) |
| *H10D 64/23* | (2025.01) |
| *H10D 64/62* | (2025.01) |

(52) U.S. Cl.
CPC ...... *H10D 30/6735* (2025.01); *H10D 30/6757* (2025.01); *H10D 62/118* (2025.01); *H10D 62/83* (2025.01); *H10D 64/01* (2025.01); *H10D 64/258* (2025.01); *H10D 64/62* (2025.01)

(58) Field of Classification Search
CPC ............. H01L 29/0665; H01L 29/0669; H01L 29/0673; H01L 29/42392; H01L 29/78696; H10D 30/6735; H10D 30/6736; H10D 30/6757
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |

(Continued)

OTHER PUBLICATIONS

Singh, Rajenda, and Richard K. Ulrich. "High and low dielectric constant materials." The Electrochemical Society Interface 8.2 (1999): pp. 26-30. (Year: 1999).*

*Primary Examiner* — Reema Patel
(74) *Attorney, Agent, or Firm* — Seed IP Law Group

(57) ABSTRACT

A device includes a substrate. A channel region of a transistor overlies the substrate and a source/drain region is in contact with the channel region. The source/drain region is adjacent to the channel region along a first direction. A source/drain contact is disposed on the source/drain region. A gate electrode is disposed on the channel region and a gate contact is disposed on the gate electrode. A first low-k dielectric layer is disposed between the gate contact and the source/drain contact along the first direction.

20 Claims, 18 Drawing Sheets

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2014/0151639 A1* | 6/2014 | Chang .............. H01L 29/0673 257/27 |
| 2019/0305135 A1* | 10/2019 | Radosavljevic .. H01L 21/02609 |
| 2019/0355723 A1* | 11/2019 | Miao ................ H01L 29/78684 |

\* cited by examiner

SEMICONDUCTOR DEVICE HAVING A GATE CONTACT ON A LOW-K LINER

BACKGROUND

There has been a continuous demand for increasing computing power in electronic devices including smart phones, tablets, desktop computers, laptop computers and many other kinds of electronic devices. Semiconductor devices provide the computing power for these electronic devices. One way to increase computing power in semiconductor devices is to increase the number of transistors and other semiconductor device features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Source and drain regions may be coupled to the nanostructures. It can be difficult to form source and drain regions with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
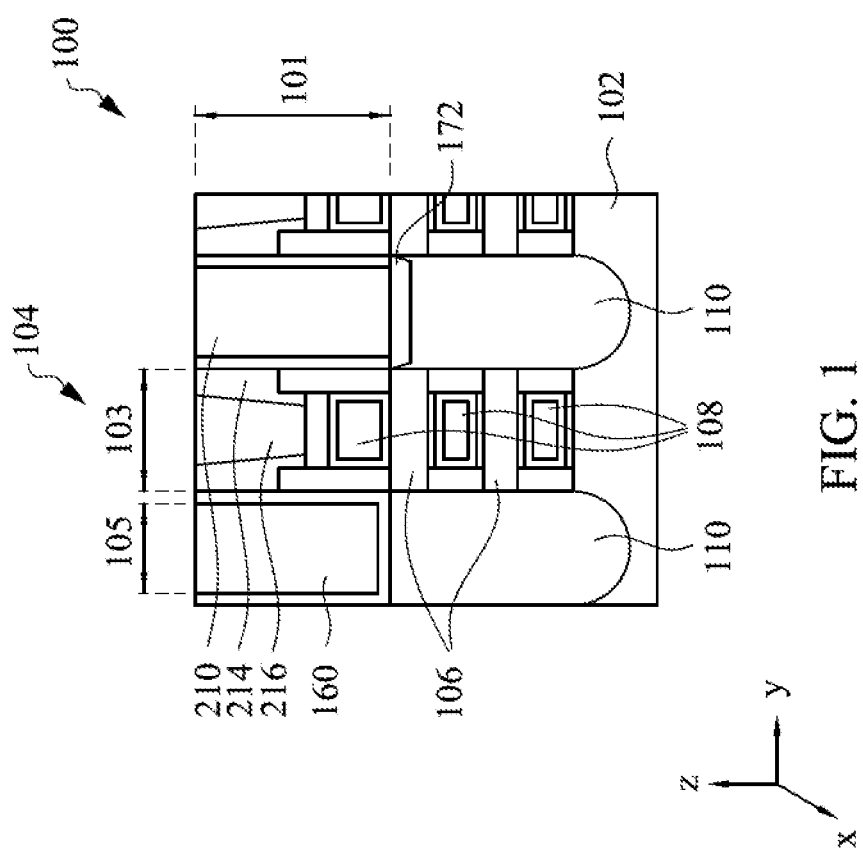
FIG. 1 is a cross-sectional view of a semiconductor device, in accordance with some embodiments.

In the following description, many thicknesses and materials are described for various layers and structures within a semiconductor device. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a semiconductor device having improved performance due at least in part to the presence of one or more low-k dielectric layers which reduces a capacitance between a gate contact and a source/drain contact. The one or more low-k dielectric layers act as a liner or body that is disposed laterally between the gate contact and the source/drain contact. Embodiments of this disclosure thus facilitate a reduction in a distance between the gate and source/drain contacts, as the reduced capacitance allows for good operation of the semiconductor device without failure due to capacitance between the gate and source/drain contacts that would otherwise exist without the presence of the low-k dielectric layers. Additionally, in some embodiments of the present disclosure, a process of forming the semiconductor device is provided that includes an isotropic etching step which facilitates formation of the device including the low-k dielectric layers with reduced complexity and number of processing steps.

FIG. 1 is a cross-sectional view illustrating a semiconductor device 100, in accordance with some embodiments. The semiconductor device 100 includes a semiconductor substrate 102. The semiconductor device also includes a transistor 104 on the semiconductor substrate 102. As set forth in more detail below, the semiconductor device 100 includes a low-k dielectric layer 214 that acts as a liner or body that is disposed laterally between a gate contact 216 and a source/drain contact 210. The presence of the low-k dielectric layer 214 facilitates a reduction in the capacitance between the gate contact 216 and the source/drain contact 210, and the transistor performance can be accordingly enhanced.

The transistor 104 includes a stack of semiconductor nanostructures 106, a gate electrode 108, and source/drain regions 110. A silicide 172 is in contact with one or more of the source/drain regions 110. A source/drain contact 210 contacts the silicide 172. The semiconductor nanostructures 106 act as channel regions of the transistor 104. The transistor 104 can be operated by applying voltages to the gate electrode 108 and the source/drain contact 210 in order to enable or prevent current flowing through the semiconductor nanostructures 106 between source/drain regions 110.

The semiconductor nanostructures 106 each extend between the neighboring source/drain regions 110. The semiconductor nanostructures 106 can include a monocrystalline semiconductor material such as silicon, silicon germanium, or other semiconductor materials. The semiconductor nanostructures 106 may be an intrinsic semiconductor material or may be a doped semiconductor material. The semiconductor nanostructures may include nanosheets, nanowires, or other types of nanostructures.

The gate electrode 108 includes one or more conductive materials. In some embodiments, the gate electrode 108 surrounds (e.g., surrounds at least four sides) the nanostructures 106 such that each semiconductor nanostructure 106 extends through the gate electrode 108 between the source/drain regions 110. A gate dielectric surrounds the nanostructures 106 and acts as a dielectric sheath between the nanostructures 106 and the gate electrode 108. Accordingly, the transistor 104 may be considered a gate all around nanostructure transistor. While examples illustrated herein primarily utilized gate all around transistors, other types of transistors can be utilized without departing from the scope of the present disclosure, including, but not limited to, nanowire or fin FET transistor structures.

Figure 2B:
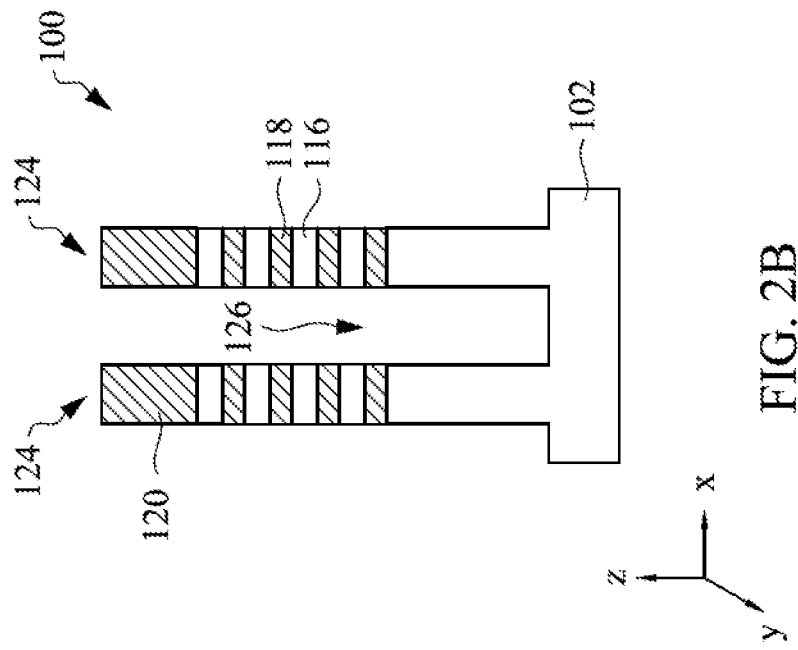
FIGS. 2A-2Y are cross-sectional views of a semiconductor device, at various stages of processing to manufacture the semiconductor device shown in FIG. 1, in accordance with some embodiments.
Figure 2A:
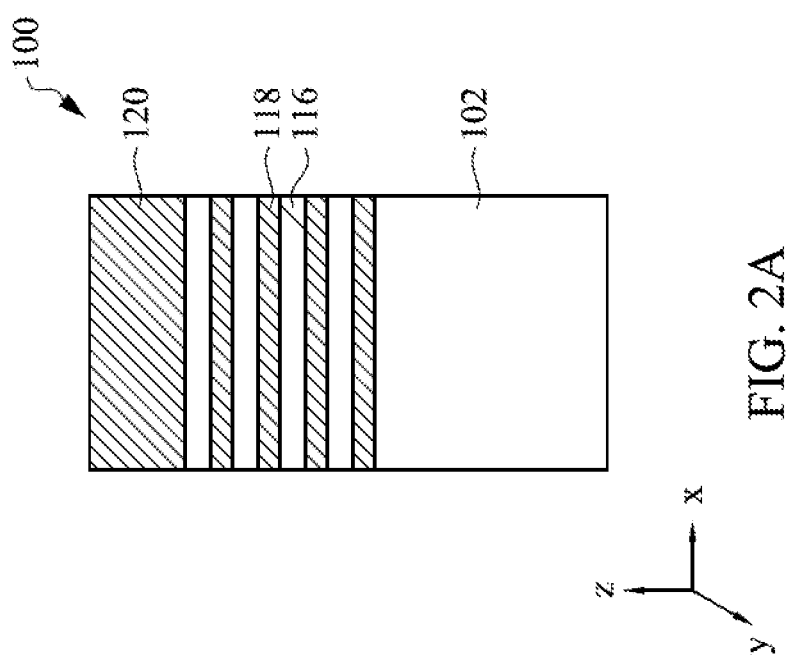
Figure 2D:
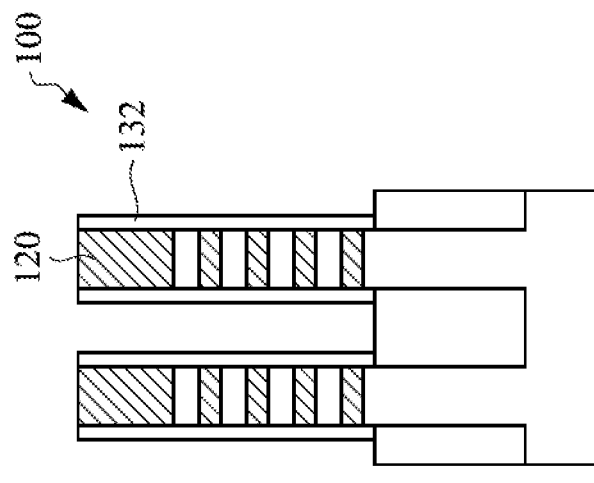
Figure 2C:
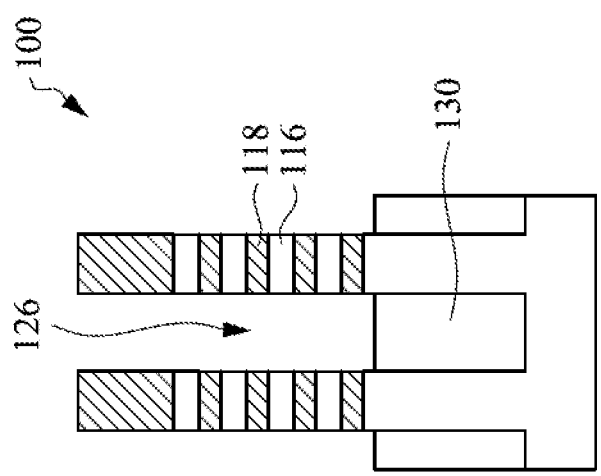
Figure 2F:
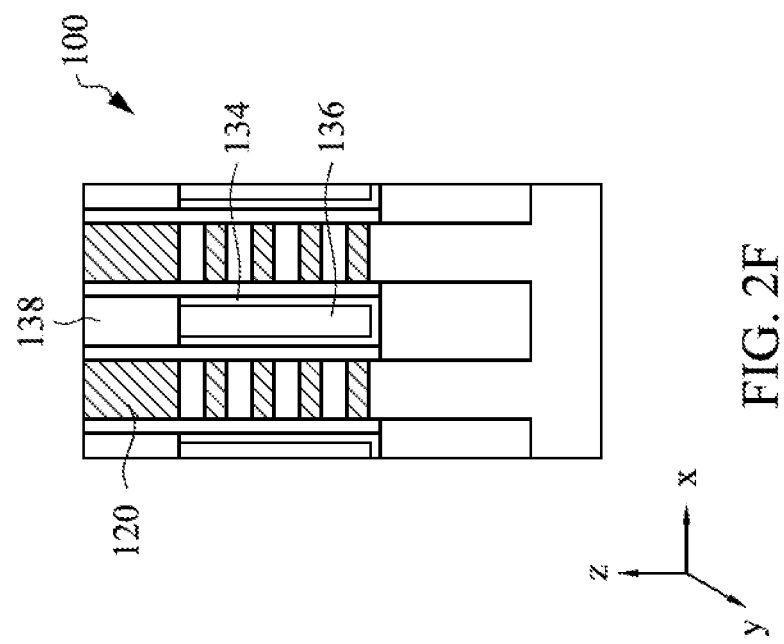
Figure 2E:
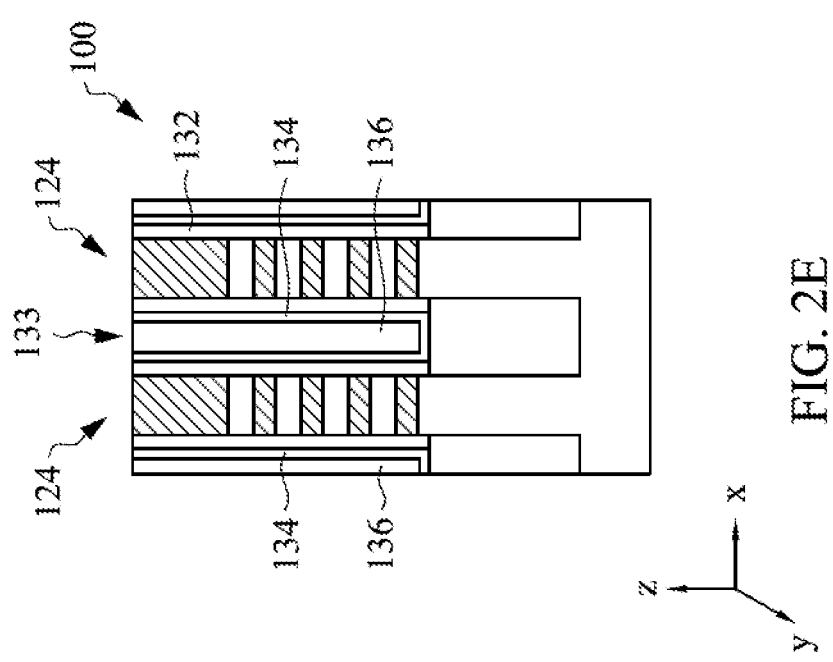
Figure 2H:
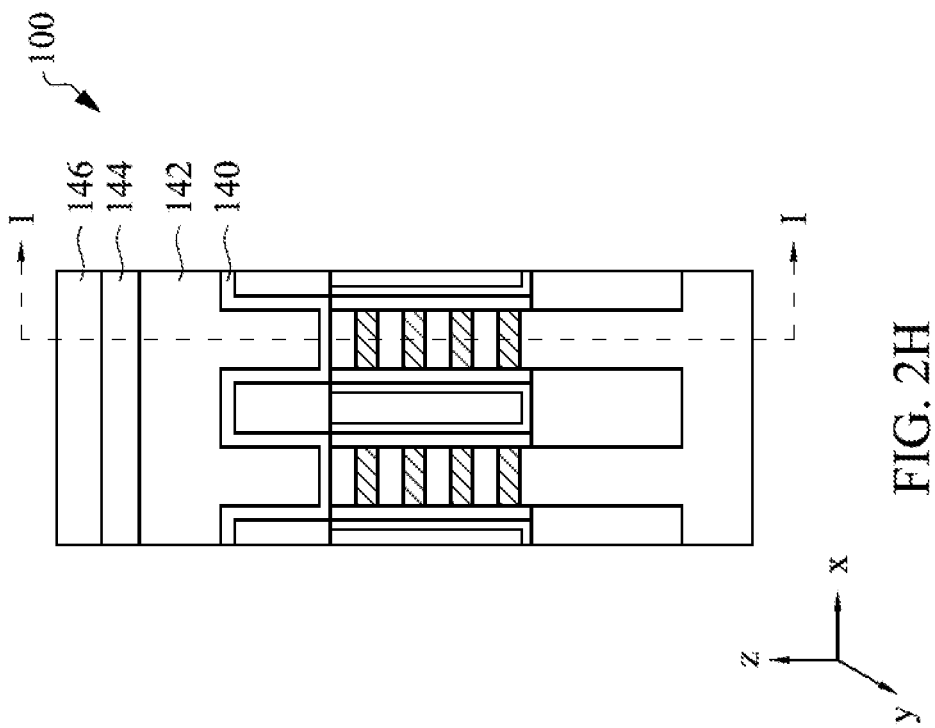
Figure 2G:
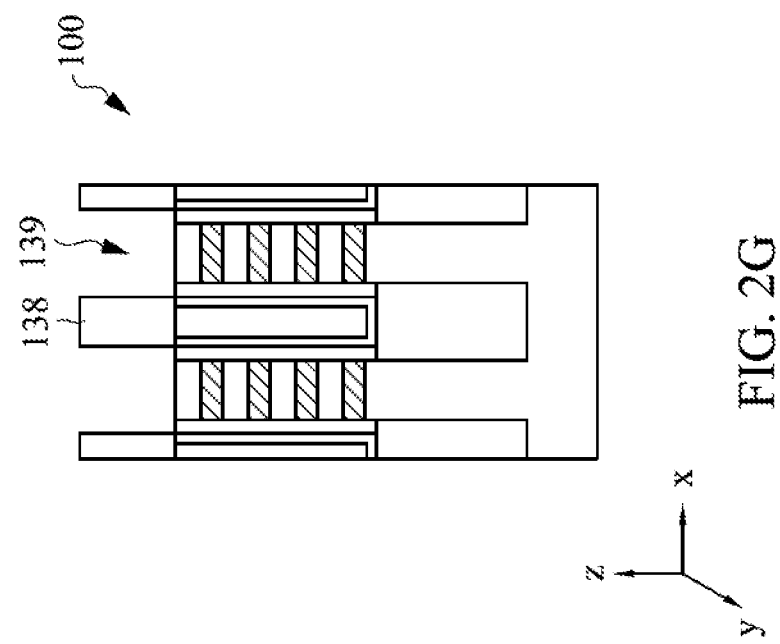
Figure 2J:
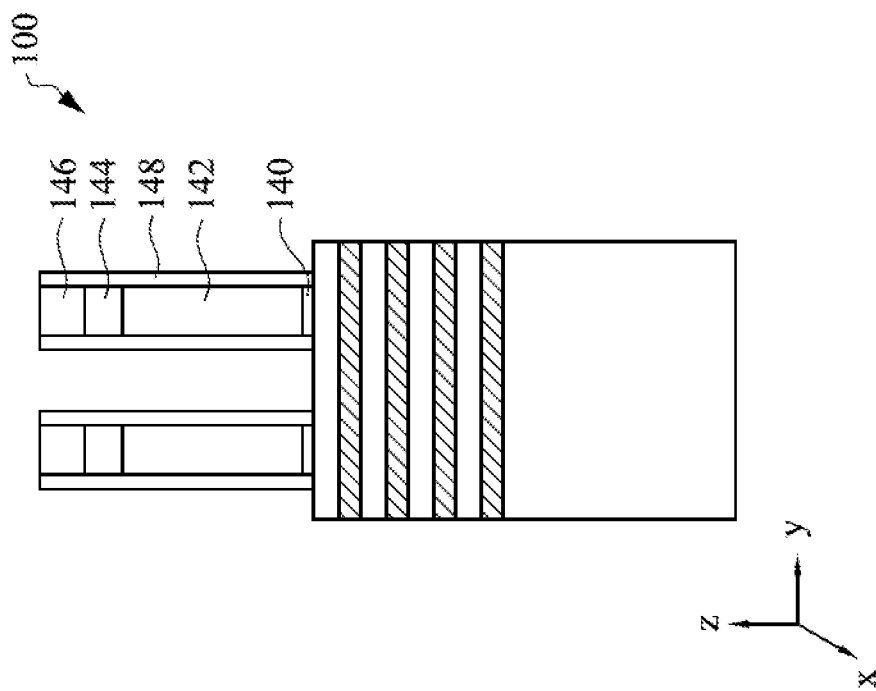
Figure 2I:
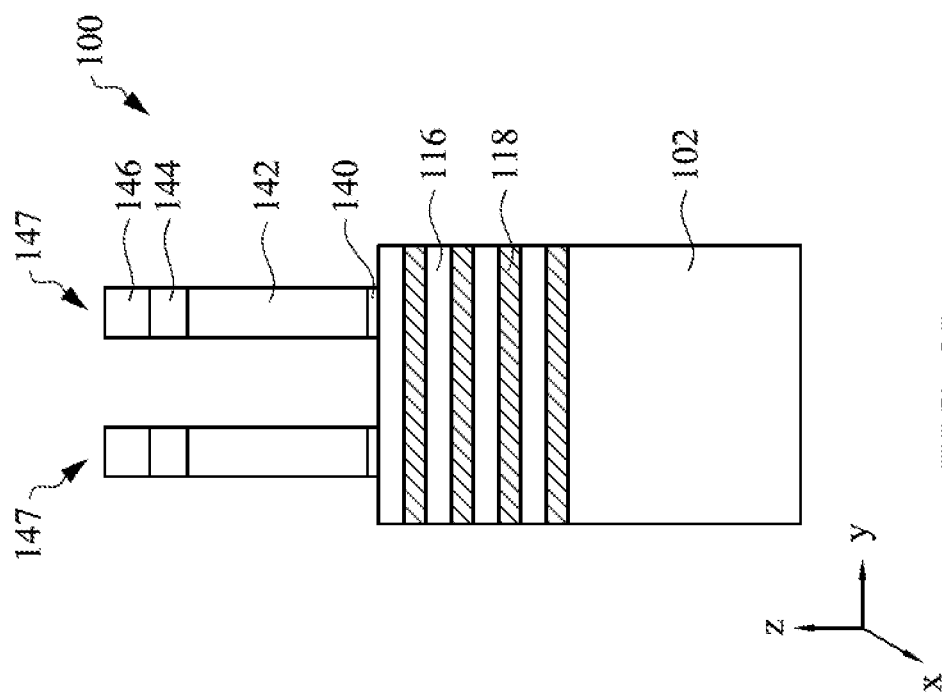
Figure 2L:
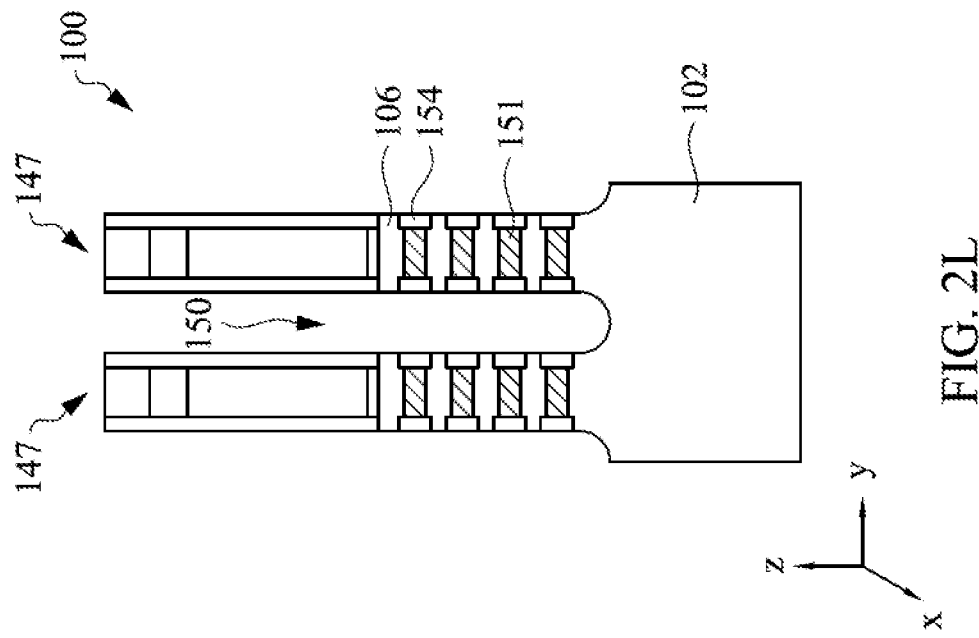
Figure 2K:
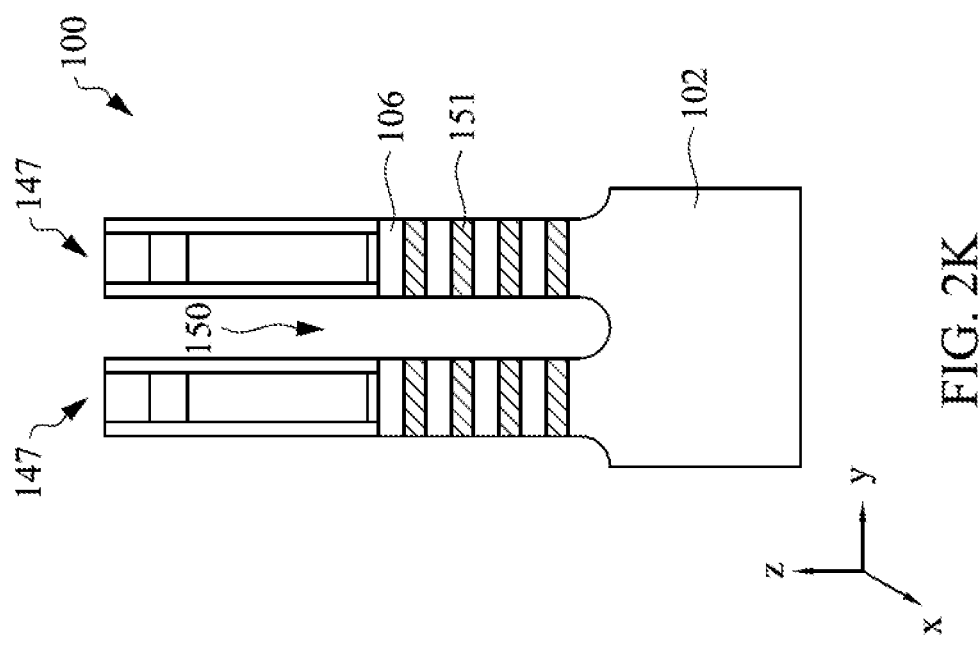
Figure 2N:
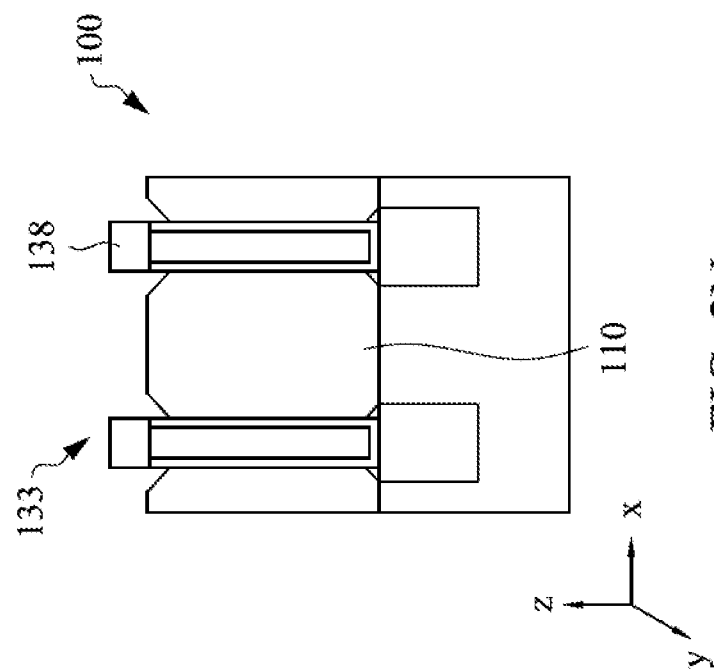
Figure 2M:
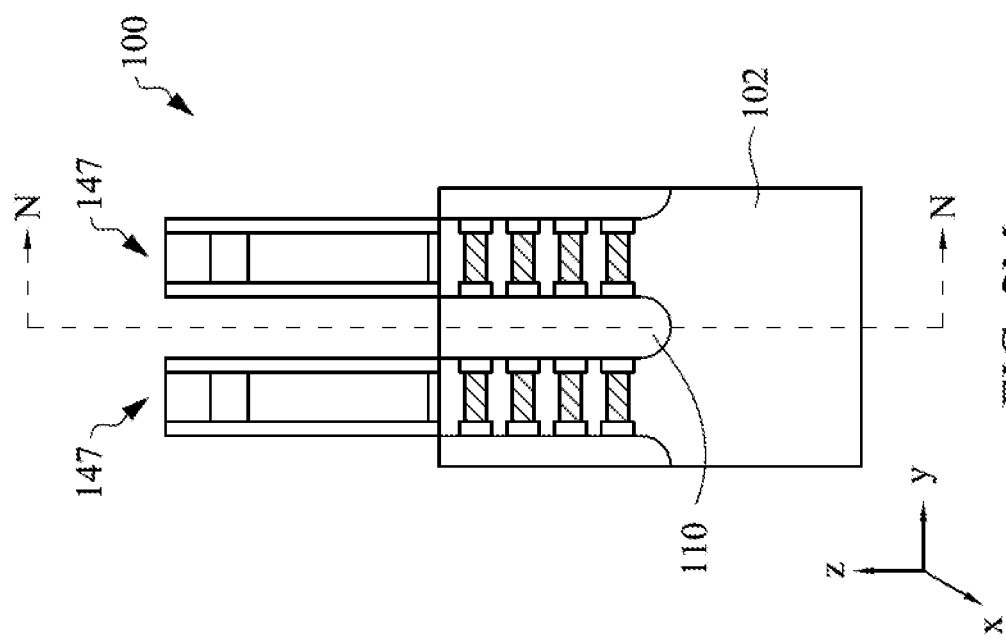
Figure 2Q:
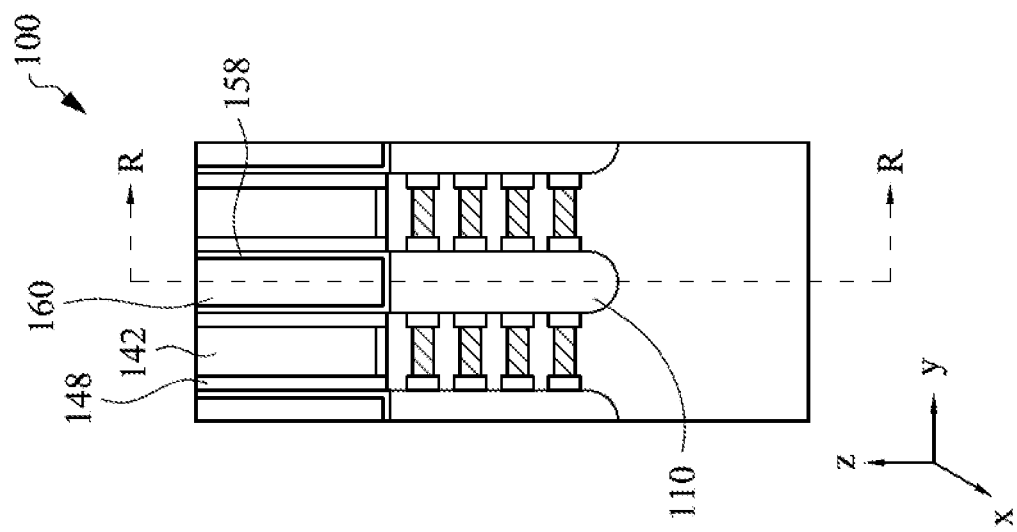
Figure 2P:
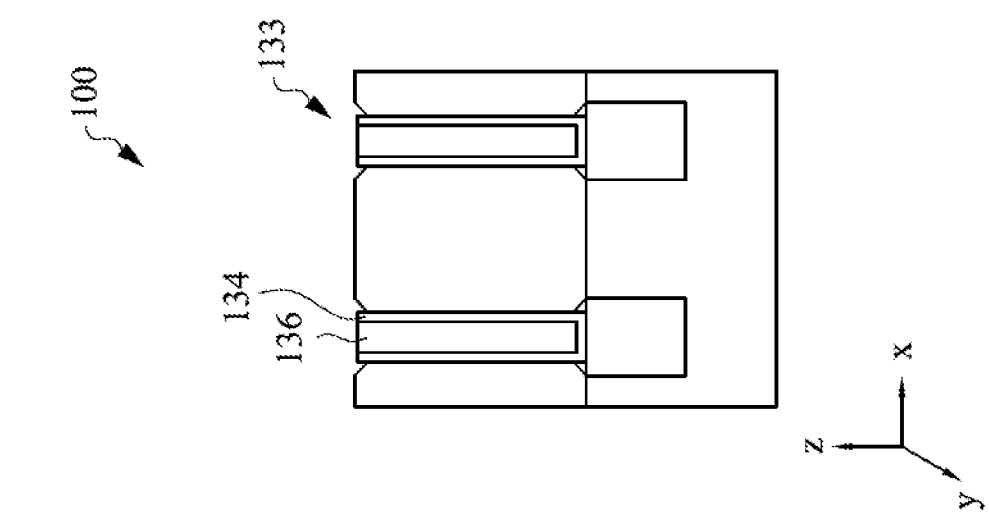
Figure 2O:
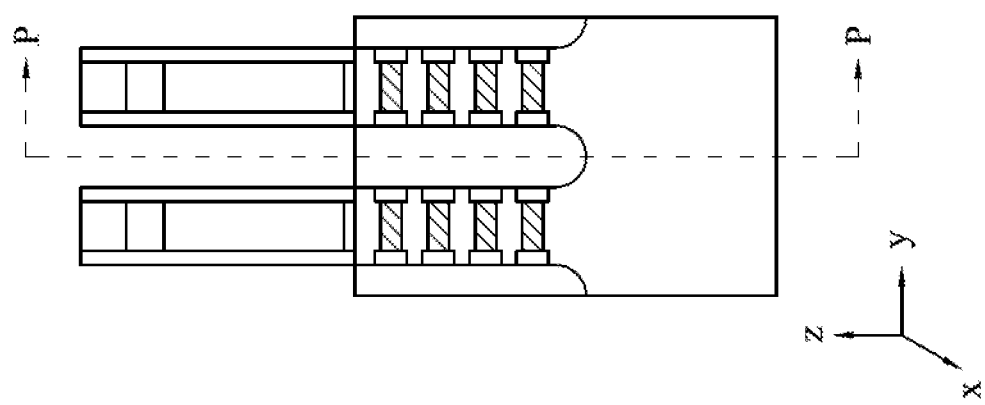
Figure 2R:
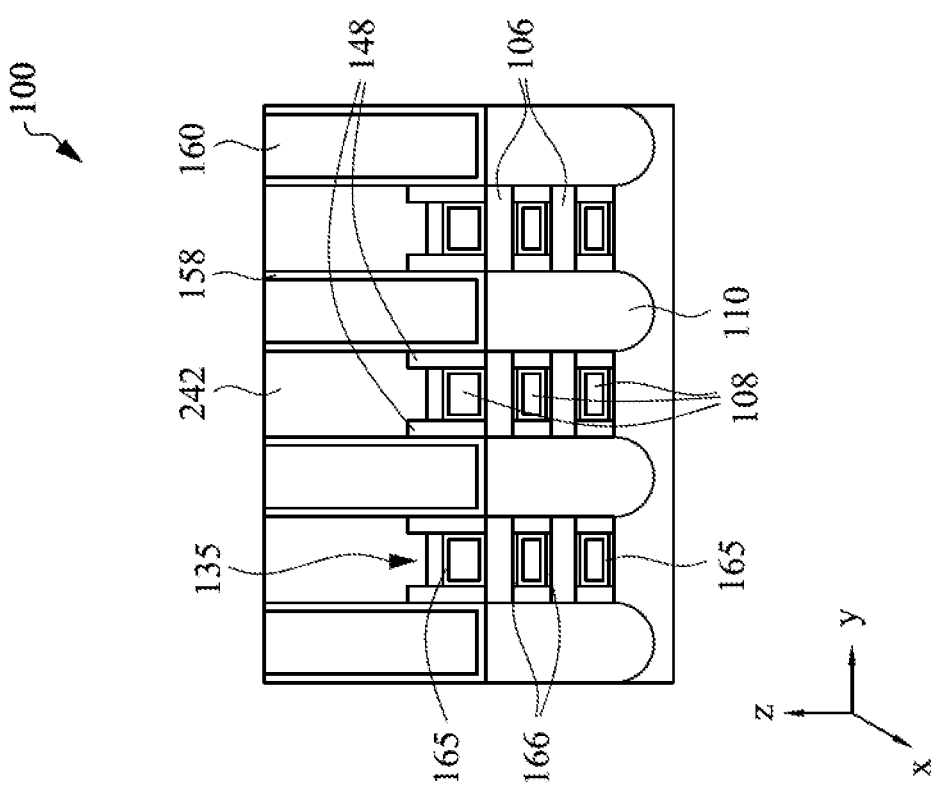
Figure 2S:
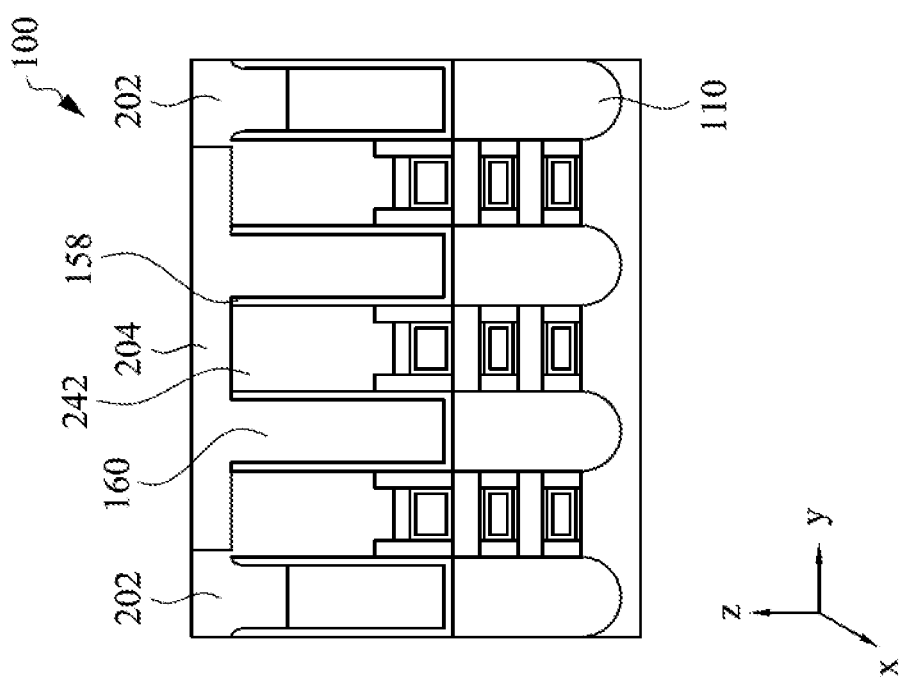
Figure 2U:
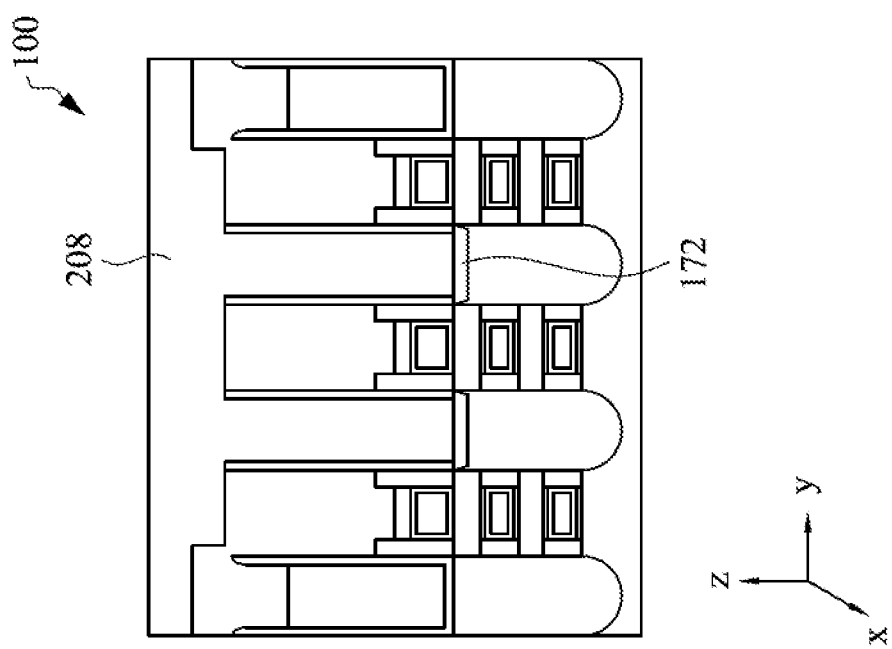
Figure 2T:
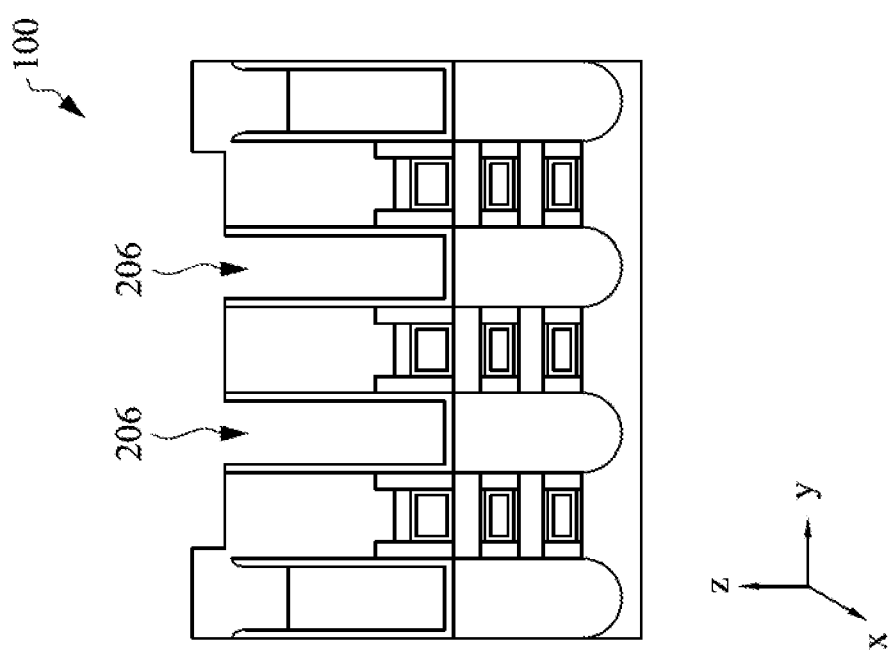
Figure 2W:
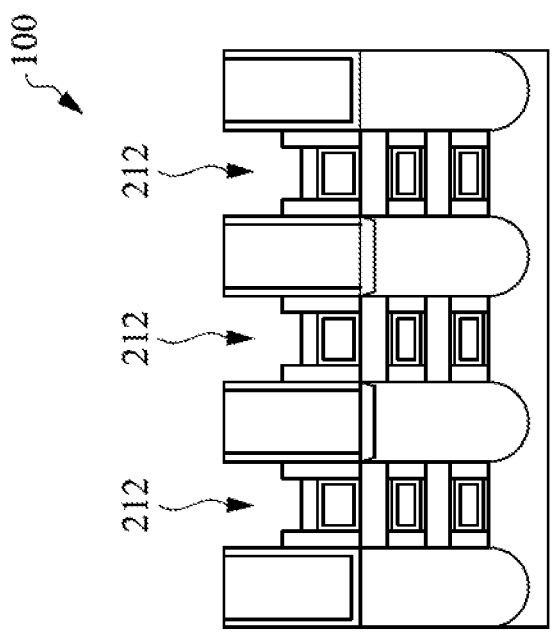
Figure 2V:
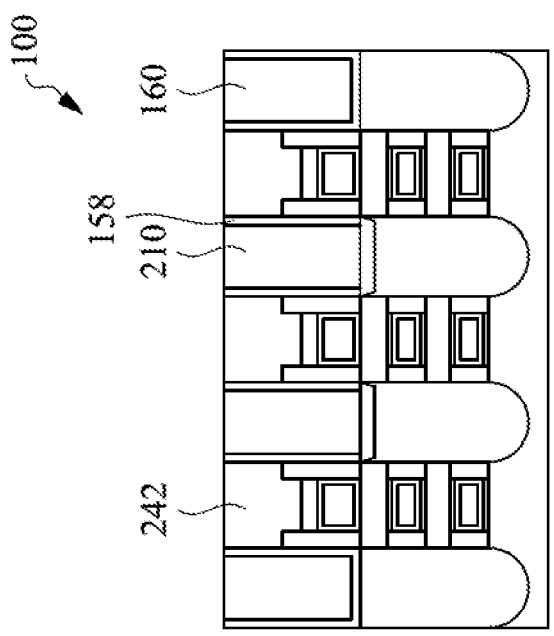
Figure 2Y:
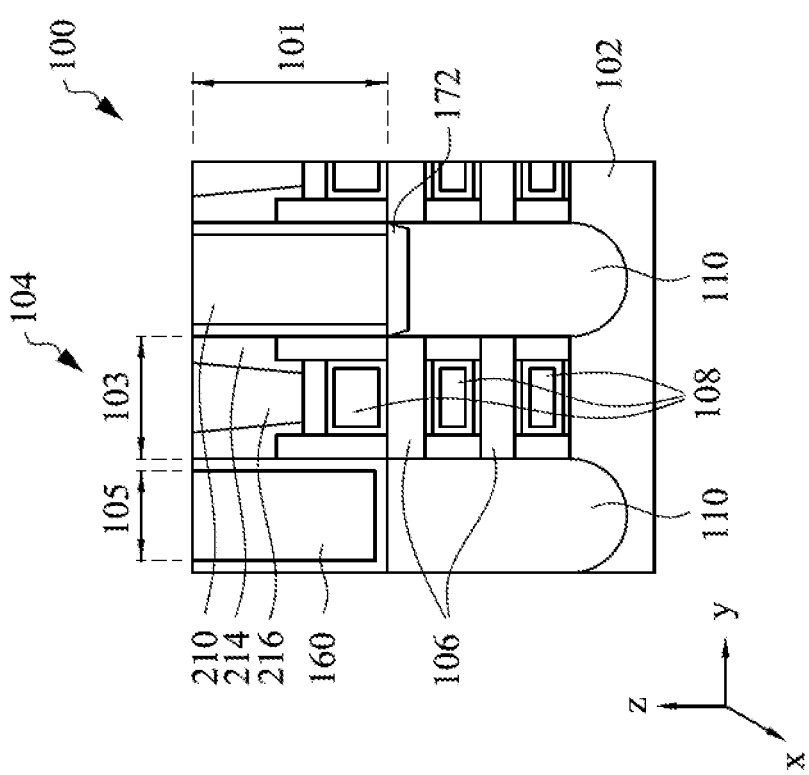

FIGS. 2A-2Y are cross-sectional views of an semiconductor device 100 at various stages of processing, according to some embodiments. FIGS. 2A-2Y illustrate an exemplary process for producing an semiconductor device that includes one or more nanostructure transistors. FIGS. 2A-2Y illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

FIGS. 2A-2Y also each include axes that indicate the orientation of the cross-sectional view of that figure. The axes include lateral axes X and Y, and vertical axis Z. All axes are mutually orthogonal with each other. Figures in which the X-axis extends from right to left will be referred to as "X-Views." Figures in which the Y-axis goes from right to left will be referred to as "Y-Views."

As shown in FIG. 2A, the semiconductor device 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants may be, for example, boron ($BF_2$) for an n-type transistor and phosphorus for a p-type transistor.

The semiconductor device 100 includes a plurality of semiconductor layers 116, which may form the semiconductor nanostructures 106. The semiconductor nanostructures 106 are layers of semiconductor material. The semiconductor layers 116 are formed over the substrate 102. The semiconductor layers 116 may include one or more layers of Si, Ge, SiGe, GaAs, InSb, GaP, GaSb, InAlAs, InGaAs, GaSbP, GaAsSb or InP. In some embodiments, the semiconductor layers 116 are formed of the same semiconductor material as the substrate 102. Other semiconductor materials can be utilized for the semiconductor layers 116 without departing from the scope of the present disclosure. In a primary non-limiting example described herein, the semiconductor layers 116 and the substrate 102 are silicon.

Sacrificial semiconductor layers 118 are disposed between the semiconductor layers 116. The sacrificial semiconductor layers 118 include a different semiconductor material than the semiconductor layers 116. In an example in which the semiconductor layers 116 include silicon, the sacrificial semiconductor layers 118 may include SiGe. In one example, the silicon germanium sacrificial semiconductor layers 118 may include between 20% and 30% germanium, though other concentrations of germanium can be utilized without departing from the scope of the present disclosure. The concentration of germanium in the silicon germanium sacrificial semiconductor layers 118 is selected to be different than the concentration of germanium in a subsequently formed SiGe sacrificial cladding. The compositions of the sacrificial semiconductor layers 118 and the sacrificial cladding are selected to result in different etching characteristics. The purpose and benefits of this will be described in further detail below.

In some embodiments, the semiconductor layers 116 and the sacrificial semiconductor layers 118 are sequentially and alternately formed, for example, by alternating epitaxial growth processes on the semiconductor substrate 102. For example, a first epitaxial growth process may result in the formation of the lowest sacrificial semiconductor layer 118 on the top surface of the substrate 102. A second epitaxial growth process may result in the formation of the lowest semiconductor layer 116 on the top surface of the lowest sacrificial semiconductor layer 118. A third epitaxial growth process results in the formation of the second lowest sacrificial semiconductor layer 118 on top of the lowest semiconductor layer 116. Alternating epitaxial growth processes may be performed until a selected number of semiconductor layers 116 and sacrificial semiconductor layers 118 have been formed.

A layer 120 is formed on top of the uppermost semiconductor layer 116. In some embodiments, the layer 120 can be a same semiconductor material as the sacrificial semiconductor layers 118. Alternatively, the layer 120 can include a dielectric material or other types of materials. In the example semiconductor device 100 illustrated in FIG. 2A, four semiconductor layers 116 are included. However, in various embodiments, the semiconductor device 100 may include more or fewer semiconductor layers 116. In some embodiments, the semiconductor device 100 may include only a single semiconductor layer 116 that is spaced apart from the substrate 102 by a single sacrificial semiconductor layer 118.

In some embodiments, the vertical thickness of the semiconductor layers 116 may be between 2 nm and 15 nm. In some embodiments, the thickness of the sacrificial semiconductor layers 118 may be between 5 nm and 15 nm. Other thicknesses and materials can be utilized for the semiconductor layers 116 and the sacrificial semiconductor layers 118 without departing from the scope of the present disclosure.

In some embodiments, the sacrificial semiconductor layers 118 correspond to a first sacrificial epitaxial semiconductor region having a first semiconductor composition. In subsequent steps, the sacrificial semiconductor layers 118 will be removed and replaced with other materials and structures. For this reason, the layers 118 are described as sacrificial. As will be described further below, the semiconductor layers 116 will be patterned to form the semiconductor nanostructures 106 of transistors 104.

As shown in FIG. 2B, trenches 126 are formed and extend through the sacrificial semiconductor layers 118, the semiconductor layers 116, and at least partially into the substrate 102. The trenches 126 define fin structures 124, each of which includes a respective stack of semiconductor layers 116 and sacrificial semiconductor layers 118. While FIG. 2B illustrates formation of two fin structures 124, it will be readily appreciated that in various embodiments, more or fewer than two fin structures may be formed in the semiconductor device 100.

The trenches 126 may be formed utilizing any suitable technique. In some embodiments, the trenches 126 may be formed by depositing a hard mask layer on the layer 120. In some embodiments, the layer 120 may itself be a hard mask layer, and in other embodiments a hard mask layer may be formed over the layer 120 and may be patterned and etched using standard photolithography processes. After the hard mask layer has been patterned and etched, portions of the sacrificial semiconductor layers 118, the semiconductor layers 116, and the substrate 102 that are not covered by the hard mask layer are selectively removed, for example, by an etching process. The etching process results in formation of the trenches 126. The etching process can include a single etching step. Alternatively, the etching process can include multiple etching steps. For example, a first etching step can etch the top sacrificial semiconductor layer 118. A second etching step can etch the top semiconductor layer 116. These alternating etching steps may be repeated until all of the sacrificial semiconductor layers 118 and semiconductor layers 116 are etched at the exposed regions. A final etching step may etch at least partially into the substrate 102.

As shown in FIG. 2C, shallow trench isolation regions 130 may be formed in the trenches 126. In some embodiments, an upper surface of the shallow trench isolation regions 130 is disposed below a level of the lowest sacrificial semiconductor layer 118 or below a level of an upper surface of the substrate 102. The shallow trench isolation regions 130 may be formed of any suitable technique. For example, in some embodiments, the shallow trench isolation regions 130 are formed by depositing a dielectric material in the trenches 126 and by recessing the deposited dielectric material so that a top surface of the dielectric material is lower than the lowest sacrificial semiconductor layer 118.

The shallow trench isolation regions 130 can be utilized to separate individual transistors or groups of transistors groups of transistors formed in conjunction with the semiconductor substrate 102. The dielectric material for the shallow trench isolation regions 130 may include silicon oxide, silicon nitride, oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 130 without departing from the scope of the present disclosure.

As shown in FIG. 2D, a cladding layer 132 may be formed on side surfaces of the fin structures 124. For example, the cladding layer 132 may be deposited on the on the sides of the semiconductor layers 116 and the sacrificial semiconductor layers 118 and on the layer 120. In some embodiments, the cladding layer 132 can be formed by an epitaxial growth from one or more of the semiconductor layers 116, the sacrificial semiconductor layers 118, and the layer 120. Alternatively, the cladding layer 132 can be deposited by a chemical vapor deposition (CVD) process. Other processes can be utilized for depositing the cladding layer 132 without departing from the scope of the present disclosure.

In some embodiments, the cladding layer 132 includes SiGe. In particular, the cladding layer 132 may include SiGe with a different concentration of germanium than the sacrificial semiconductor layers 118. The cladding layer 132 can include other concentrations, materials, or compositions without departing from the scope of the present disclosure.

As shown in FIG. 2E, hybrid fin structures 133 may be formed in the gaps between the cladding layers 132. The hybrid fin structures 133 may include a first dielectric layer 134 and a second dielectric layer 136.

In some embodiments, the first dielectric layer 134 is formed of a dielectric material, which may be a low-K dielectric material. In some embodiments, the first dielectric layer 134 may include silicon nitride. In some embodiments, the first dielectric layer 134 is formed of a dielectric material, which may include silicon oxide. The first dielectric layer 134 can be deposited on the shallow trench isolation 130 and on side surfaces of the cladding layers 132.

The second dielectric layer 136 can be deposited on the first dielectric layer 134 in the trenches filling the remaining space between the fins 124. The first dielectric layer 134 and the second dielectric layer 136 can be deposited by any suitable technique, including CVD, atomic layer deposition (ALD), or by other suitable deposition processes. After deposition of the first and second dielectric layers 134 and 136, the hybrid fin structures 133 may be planarized by a chemical mechanical planarization (CMP) process. Other materials and deposition processes can be utilized to form the hybrid fin structures 133 without departing from the scope of the present disclosure.

As shown in FIG. 2F, the hybrid fin structures 133 may be recessed. For example, an etching process may be performed to recess the top surface of the hybrid fin structures 133. In some embodiments, a timed etch may be performed to reduce the top surface of the hybrid fin structures 133 to a level that is substantially equal to or lower than the bottom of the layer 120. The etching process can include a wet etch, dry etch, or any suitable etch for recessing the hybrid fin structures 133 to a selected depth.

In FIG. 2F, a high-K dielectric layer 138 has been deposited on the hybrid fin structures 133. The high-K dielectric layer 138 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 138 may be formed by CVD, ALD, or any suitable method. A planarization process, such as a CMP process, may be performed to planarize the top surface of the high-K dielectric layer 138. The high-K dielectric layer 138 may be termed a helmet layer for the hybrid fin structures 133. Other processes and materials can be utilized for the high-K dielectric layer 138 without departing from the scope of the present disclosure.

As shown in FIG. 2G, portions of the layer 120 and to recess the cladding layer 132 are selectively removed. For example, in some embodiments, an etching process may be performed to remove the layer 120 and to recess the cladding layer 132. The etching process can be performed in one or more steps. The one or more steps selectively etch the layer 120 and the materials of the cladding layer 132 with respect to the material of the high-K dielectric layer 138. Accordingly, in FIG. 2G, the high-K dielectric layer 138 remains protruding above substantially unchanged while other layers have been recessed or removed. The one or more etching steps can include wet etches, dry etches, timed etches, or other types of etching processes.

As shown in FIG. 2H, a thin dielectric layer 140 has been deposited on the top surface of the cladding layer 132, the top semiconductor layer 116, and on the high-K dielectric layer 138. In some embodiments, the thin dielectric layer 140 may have a thickness between 1 nm and 5 nm. The thin dielectric layer 140 may be formed of any dielectric material, and in some embodiments, the thin dielectric layer 140 may include silicon oxide. Other materials, deposition processes, and thicknesses can be utilized for the thin dielectric layer 140 without departing from the scope of the present disclosure.

In FIG. 2H, a polysilicon layer 142 has been deposited on the dielectric layer 140. The polysilicon layer 142 may have a thickness between 20 nm and 100 nm. The polysilicon layer 142 may be formed by any suitable technique, including by an epitaxial growth, a CVD process, a physical vapor deposition (PVD) process, or an ALD process. Other thicknesses and deposition processes can be used for depositing the polysilicon layer 142 without departing from the scope of the present disclosure.

In FIG. 2H, a dielectric layer 144 has been formed, e.g., by deposition, on the polysilicon layer 142. A dielectric layer 146 has been formed on the dielectric layer 144. In one example, the dielectric layer 144 includes silicon nitride. In one example, the dielectric layer 146 includes silicon oxide. The dielectric layers 144 and 146 can be deposited by CVD in some embodiments, although any suitable technique for forming the dielectric layers 144, 146 may be utilized in various embodiments. The dielectric layer 144 can have a thickness between 5 nm and 15 nm in some embodiments. The dielectric layer 146 can have a thickness between 15 nm and 50 nm in some embodiments. Other thicknesses, materials, and deposition processes can be utilized for the dielectric layers 144 and 146 without departing from the scope of the present disclosure.

The dielectric layers 144 and 146 may be patterned and etched to form a mask for the polysilicon layer 142. The dielectric layers 144 and 146 can be patterned and etched using standard photolithography processes. After the dielectric layers 144 and 146 have been patterned and etched to form the mask, the polysilicon layer 142 is etched so that only the material of the polysilicon layer 142 directly below the dielectric layers 144 and 146 remains. The resulting structure is a polysilicon fin.

FIG. 2I is a cross-sectional view of the semiconductor device 100 taken along cut line I shown in FIG. 2H. As shown in FIG. 2I, the layers 146, 144, 142, and 140 have been patterned and etched to form dummy gate structures 147. Formation of the dummy gate structures 147 can be accomplished using standard photolithography processes including forming a photoresist mask in the desired pattern of the dummy gate structures 147 and then performing an etching process in the presence of the mask. The photolithography process can also include formation of a hard mask.

As shown in FIG. 2J, a gate spacer layer 148 has been deposited on the top surfaces of the top semiconductor layer 116, as well as on the sides of the thin dielectric layer 140, the polysilicon layer 142, and the dielectric layers 144 and 146. In one example, the gate spacer layer 148 includes SiCON. The gate spacer layer 148 can be deposited by CVD, PVD, or ALD. Other materials and deposition processes can be utilized for the gate spacer layer 148 without departing from the scope of the present disclosure.

As shown in FIG. 2K, recesses 150 are formed extending through the semiconductor layers 116, the sacrificial semiconductor layers 118, and at least partially into the substrate 102. The recesses 150 may be formed by any suitable technique, including by selectively removing portions of the semiconductor layers 116, the sacrificial semiconductor layers 118, and the substrate 102. In some embodiments, the recesses 150 may be formed by etching the semiconductor layers 116, the sacrificial semiconductor layers 118, and the substrate 102 using the dummy gate structures 147 as a mask. The formation of recesses 150 concurrently forms or defines the semiconductor nanostructures 106 from the remaining portions of the semiconductor layers 116. Similarly, sacrificial semiconductor nanostructures 151 are formed or defined by the remaining portions of the sacrificial semiconductor layers 118.

Each dummy gate structure 147 corresponds to a position at which a transistor 104 will be formed. More particularly, gate electrodes 108 will eventually be formed in place of the dummy gate structures 147 and the sacrificial semiconductor nanostructures 151. Each stack of semiconductor nanostructures 106 will correspond to the channel regions of a respective transistor 104. FIG. 2K illustrates the locations of two transistors 104. The two transistors 104 will share a common source/drain region 110 as will be set forth in further detail below.

As shown in FIG. 2L, lateral portions of the sacrificial semiconductor nanostructures 151 are removed and replaced with inner spacers 154. The lateral portions of the sacrificial semiconductor nanostructures 151 may be removed by any suitable technique, including, for example, by an etching process to laterally recess the sacrificial semiconductor nanostructures 151 with respect to the semiconductor nanostructures 106. The etching process can be performed by a chemical bath that selectively etches the sacrificial semiconductor nanostructures 151 with respect to the semiconductor nanostructures 106. The etching process is timed so that the sacrificial semiconductor nanostructures 151 are recessed but not entirely removed. The recessing process is utilized to enable the formation of an inner spacer layer between the semiconductor nanostructures 106 at the locations where the sacrificial semiconductor nanostructures 151 have been recessed.

The inner spacers 154 are formed by any suitable technique (e.g., by deposition) at the sides of the semiconductor nanostructures 106. The inner spacers 154 can be deposited by an ALD process, a CVD process, or other suitable processes. In one example, the inner spacers 154 includes silicon nitride.

FIG. 2M is a Y-view of the semiconductor device 100, and FIG. 2N is an X-view of the semiconductor device 100 taken along the cut line N of FIG. 2M.

As shown in FIG. 2M source/drain regions 110 have been formed. The source/drain regions 110 include semiconductor material. In some embodiments, the source/drain regions 110 may be grown epitaxially from the semiconductor nanostructures 106. The source/drain regions 110 can be epitaxially grown from the semiconductor nanostructures 106 and from the substrate 102. The source/drain regions 110 can be doped with N-type dopants species in the case of N-type transistors, and can be doped with P-type dopant species in the case of P-type transistors. The doping can be performed in-situ during the epitaxial growth. In some embodiments, the source/drain regions 110 may have a thickness between 2 nm and 10 nm. The source/drain regions 110 may be in direct contact with the semiconductor nanostructures 106.

As shown in FIG. 2N, the source/drain regions 110 extend between adjacent hybrid fin structures 133. In some embodiments, the source/drain regions 110 may have a top surface that extends to a level that is higher than a level of an upper surface of the hybrid fin structures 133. As shown, the high-K dielectric layer 138 may remain on the hybrid fin structures 133 during formation of the source/drain regions 110.

FIG. 2O is a Y-view of the semiconductor device 100, and FIG. 2P is an X-view of the semiconductor device 100 taken along the cut line P of FIG. 2O. As shown in FIG. 2P, the high-K dielectric layer 138 is removed. The high-K dielectric layer 138 may be removed by any suitable process, which in some embodiments may include by an etching process. After removal of the high-K dielectric layer 138, upper surfaces of the hybrid fin structures 133 are exposed.

For example, upper surfaces of the first and second dielectric layers 134, 136 may be exposed by the removal of the high-K dielectric layer 138.

As shown in FIG. 2Q, a dielectric layer 158 has been deposited on sidewalls of the gate spacer layers 148 and on top of the source/drain regions 110. The dielectric layer 158 may be formed of any suitable dielectric material and can be deposited by ALD, CVD, or PVD. In some embodiments, the dielectric layer 158 includes one or more of SiN, SiCN, SiC, SiOC, SiOCN, $HfO_2$, $ZrO_2$, $ZrAlO_x$, $HfAlO_x$, $HfSiO_x$, and $Al_2O_3$. In some embodiments, the dielectric layer 158 has a thickness that is less than 10 nm. In some embodiments, the thickness of the dielectric layer 158 is within a range from 1 nm to 5 nm.

A dielectric layer 160 has been deposited on the dielectric layer 158. The dielectric layer 160 can include silicon oxide or another suitable material and can be deposited by ALD, CVD, or PVD. Other materials and deposition processes can be utilized for the dielectric layers 158 and 160 without departing from the scope of the present disclosure.

In some embodiments, the semiconductor device 100 may be planarized, for example by CMP, resulting in a planarized upper surface. The planarization may remove the dielectric layers 144 and 146, and may remove corresponding portions of the gate spacer layer 148. The planarization may expose an upper surface of the polysilicon layer 142. In some embodiments, upper surfaces of the dielectric layers 158 and 160, the gate spacer layer 148, and the polysilicon layer 142 may be substantially coplanar with one another.

As shown in FIG. 2R, a metal gate 135 is formed, and the metal gate 135 includes a gate electrode 108 and a gate dielectric layer 166. Further, as shown in FIG. 2R, the dummy gates 147 have been removed. The dummy gates 147 may be removed by any suitable technique, and in some embodiments, the dummy gates 147 may be removed by one or more etching steps. The etching steps may include etching steps to remove the dielectric layer 146, then the dielectric layer 144, then the polysilicon layer 142, then the dielectric layer 140. Various other processes can be performed to remove the dummy gate structures 147 without departing from the scope of the present disclosure.

It is noted that the semiconductor device 100 is illustrated in FIG. 2R as including only two semiconductor nanostructures 106, while the device 100 is previously illustrated herein as including three or more semiconductor nanostructures 106. It will be readily appreciated that the number of semiconductor nanostructures 106 depicted in FIG. 2R and subsequent Figures is provided solely for convenience of description thereof, and more or fewer than two semiconductor nanostructures 106 may be included in the device 100.

As shown in FIG. 2R, the sacrificial semiconductor nanostructures 151 have been removed. The sacrificial semiconductor nanostructures 151 can be removed after removal of the dummy gates 147. The sacrificial semiconductor nanostructures 151 can be removed with an etching process that selectively etches the sacrificial semiconductor nanostructures 151 with respect to the semiconductor nanostructures 106 and the inner spacers 154. Various other processes can be utilized to remove the sacrificial semiconductor nanostructures 151 without departing from the scope of the present disclosure.

As shown in FIG. 2R, an interfacial dielectric layer 165 is formed on exposed surfaces of the semiconductor nanostructures 106. The interfacial dielectric layer 165 may be formed by any suitable technique, including, for example, by a deposition process.

The interfacial dielectric layer 165 may include a dielectric material such as silicon oxide, silicon nitride, or other suitable dielectric materials. The interfacial dielectric layer 165 may include a comparatively low-K dielectric with respect to high-K dielectric such as hafnium oxide or other high-K dielectric materials that may be used in gate dielectrics of transistors.

The interfacial dielectric layer 165 may be formed by a thermal oxidation process, a chemical vapor deposition (CVD) process, or an atomic layer deposition (ALD) process. In some embodiments, the interfacial dielectric layer 165 may have a thickness between 0.5 nm and 2 nm. One consideration in selecting a thickness for the interfacial dielectric layer is to leave sufficient space between the nanosheets 106 for gate metals, as will be explained in more detail below. Other materials, deposition processes, and thicknesses can be utilized for the interfacial dielectric layer without departing from the scope of the present disclosure.

As shown in FIG. 2R, a gate dielectric is formed. The gate dielectric may include the interfacial dielectric layer 165 and a high-K gate dielectric layer 166 positioned on the interfacial dielectric layer 165. Together, the interfacial dielectric layer 165 and the high-K gate dielectric layer 166 form a gate dielectric for the gate all around nanosheet transistors.

The high-K gate dielectric layer 166 and the interfacial dielectric layer 165 physically separate the semiconductor nanostructures 106 from the gate metals that will be deposited in subsequent steps. The high-K gate dielectric layer 166 and the interfacial dielectric layer 165 isolate the gate metals from the semiconductor nanostructures 106 that correspond to the channel regions of the transistors.

The high-K gate dielectric layer 166 may include one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer 166 may be formed by CVD, ALD, or any suitable method. In some embodiments, the high-K gate dielectric layer 166 is formed using a highly conformal deposition process such as ALD in order to ensure the formation of a gate dielectric layer having a uniform thickness around each semiconductor nanosheet 106. In some embodiments, the thickness of the high-k dielectric 166 is in a range from about 1 nm to about 3 nm. Other thicknesses, deposition processes, and materials can be utilized for the high-K gate dielectric layer 166 without departing from the scope of the present disclosure. The high-K gate dielectric layer 166 may include a first layer that includes HfO2 with dipole doping including La and Mg, and a second layer including a higher-K ZrO layer with crystallization.

After forming the gate dielectric by, for example, deposition of the high-K gate dielectric layer 166, the gate electrode 108 is formed, for example, by depositing a gate metal in the voids formed by removal of the dummy gate structures 147. The gate electrode 108 surrounds the semiconductor nanostructures 106. In particular, the gate electrode 108 is in contact with the gate dielectric, e.g., with the high-K gate dielectric layer 166. The gate electrode 108 is positioned between semiconductor nanostructures 106. In other words, the gate electrode 108 is positioned all around the semiconductor nanostructures 106. For this reason, the transistors formed in relation to the semiconductor nanostructures 106 are called gate all around transistors.

Although the gate electrode 108 is shown as a single metal layer, in practice the gate electrode 108 may include multiple metal layers. For example, the gate electrode 108 may include one or more very thin work function layers in contact with the gate dielectric. The thin work function layers can include titanium nitride, tantalum nitride, or other conductive materials suitable for providing a selected work function for the transistors. The gate electrode 108 can further include a gate fill material that corresponds to the majority of the gate electrode 108. The gate fill material can include cobalt, tungsten, aluminum, or other suitable conductive materials. The layers of the gate electrode 108 can be deposited by PVD, ALD, CVD, or other suitable deposition processes.

In some embodiments, the uppermost portion or segment of the gate electrodes 108 may be selectively thinned, for example, by an etch back process. Similarly, portions of the gate spacer layer 148 may be selectively removed, for example, to decrease a height of the gate spacer layer 148 as shown in FIG. 2R. The portions of the gate spacer layer 148 may be selectively removed by any suitable process, including, for example, by an etching process.

As shown in FIG. 2R, in some embodiments, the gate spacer layer 148 may have a height that is greater than a height of the upper most portion or segment of the gate electrodes 108. Dummy gate contacts 242 are formed on the gate electrode 108 and on the gate spacer layer 148. As shown in FIG. 2R, the dummy gate contacts 242 extend over each of the gate structures between portions of the dielectric layer 158. The dummy gate contacts 242 may be formed of any suitable material, and in some embodiments, the dummy gate contacts 242 may be formed of a semiconductor material. In some embodiments, the dummy gate contacts 242 may be formed of poly silicon.

As shown in FIG. 2S, a contact end cut (CMD) layer 202 may be selectively formed on the dielectric layer 160 overlying one or more of the source/drain regions 110. The CMD layer 202 is positioned to protect the dielectric layer 160 within one or more regions between adjacent gate structures. The CMD layer 202 is intended to keep the material of the dielectric layer 160 within the protected regions as the material of the dielectric layer 160 is selectively removed and replaced in other regions, as described in further detail below. The CMD layer 202 may be formed by any suitable technique, including, for example, by deposition of the material forming the CMD layer 202. The CMD layer 202 may be formed of any suitable material, which in some embodiments may include a hard mask material, a dielectric layer such as an oxide or other dielectric material, or a semiconductor material such as amorphous silicon or polysilicon. In some embodiments, the CMD layer 202 may be deposited and then patterned to form the protective regions over the dielectric layer 160, for example, by a photolithographic masking and etching process.

In some embodiments, a dielectric layer 204 may be formed on upper surfaces of the dummy gate contacts 242, the dielectric layer 160, and the dielectric layer 158, and the dielectric layer 204 may extend laterally between portions of the CMD layer 202, as shown in FIG. 2S. The dielectric layer 204 may be formed by any suitable technique, including, for example, by deposition.

As shown in FIG. 2T, the dielectric layer 204 and portions of the dielectric layer 160 and the dielectric layer 158 are removed. The layers may be removed by any suitable process. For example, in some embodiments, an etching process may be performed to remove the dielectric layer 204 and the portions of the dielectric layer 160 and the dielectric layer 158. The etching process can be performed in one or more steps. The one or more steps selectively etch the dielectric layer 204 and portions of the dielectric layer 160 and the dielectric layer 158 with respect to the materials of the dummy gate contacts 242, the CMD layer 202, and the dielectric layer 158. Accordingly, as shown in FIG. 2T, openings 206 are formed overlying one or more of the source/drain regions 110. The one or more etching steps can include wet etches, dry etches, timed etches, or other types of etching processes. In some embodiments, the etching includes a plasma etching process.

In some embodiments, a portion of the dielectric layer 158 may be removed from an upper surface of the source/drain regions 110 in the openings 206.

As shown in FIG. 2U, a silicide 172 has been formed on the source/drain regions 110 that were exposed in the openings 206. The silicide 172 is formed on top of the source/drain regions 110. In some embodiments, the silicide 172 may be formed on side surfaces of the source/drain regions 110, e.g., along the x-axis direction. In some embodiments, the silicide 172 may be a "wrap around" silicide that covers and contacts at least the top surface and two side surfaces of each of the source/drain regions 110. This increases a contact area between the silicide 172 and the source/drain regions 110.

The silicide 172 can include any suitable silicide. In some embodiments, the silicide 172 is a silicide including one or more of nickel, cobalt, titanium, tantalum, platinum, tungsten, other noble metals, other refractory metals, rare earth metals or their alloys. In some embodiments, the silicide 172 includes one or more of titanium silicide, cobalt silicide, ruthenium silicide, aluminum silicide, nickel silicide, or other silicides. The silicide 172 may be formed using any suitable technique. In some embodiments, the silicide 172 can be grown by performing a high-temperature annealing process in the presence of the metal and the silicon from which the silicide 172 is formed. The result of the silicide growth process is that silicide 172 grows from all exposed surfaces of the source/drain regions 110. The silicide 172 can include other materials and deposition processes without departing from the scope of the present disclosure.

The contact between the silicide 172 and the source/drain regions 110 reduces a contact resistance along a current path through the source/drain regions 110 to the semiconductor nanostructures 106, as the relatively high resistance source/drain material may be substantially surrounded (e.g., along at least three sides in some embodiments) by the highly conductive silicide 172.

In some embodiments, the silicide 172 has a thickness of less than 10 nm. In some embodiments, the silicide 172 has a thickness between 0.5 nm and 5 nm. The silicide 172 can have other dimensions and shapes without departing from the scope of the present disclosure.

As shown in FIG. 2U, a conductive layer 208 is formed in the openings 206 and on upper surfaces of the dummy gate contacts 242 and the CMD layer 202. The conductive layer 208 may be any suitable conductive material. In some embodiments, the conductive layer 208 may be formed of W, Ru, Co, Cu, Ti, TiN, Ta, TaN, Mo, Ni, although any suitable material may be used, such as aluminum, copper, alloys of these, combinations of these, or the like, and may be deposited using a deposition process such as sputtering, chemical vapor deposition, electroplating, electroless plating, or the like, to fill and/or overfill the openings 206. In some embodiments, the conductive layer 208 is formed on and in contact with the silicide 172 in the openings 206.

As shown in FIG. 2V, the semiconductor device 100 is planarized, for example by CMP, resulting in a planarized upper surface. The planarization may remove the CMD layer 202 and portions of the conductive layer 208, the dummy gate contacts 242, the dielectric layer 160, and the dielectric layer 158. The planarization forms the source/drain contacts 210 overlying corresponding source/drain regions 110 by the removal of the portions of the conductive layer 208. The planarization may expose upper surfaces of the source/drain contacts 210, the dummy gate contacts 242, the dielectric layer 160, and the dielectric layer 158. In some embodiments, upper surfaces of the dummy gate contacts 242, the dielectric layer 160, and the dielectric layer 158 may be substantially coplanar with one another.

As shown in FIG. 2W, openings 212 are formed by selectively removing the dummy gate contacts 242. The dummy gate contacts 242 may be selectively removed, for example, by an etching process. The etching process can include a single etching step. Alternatively, the etching process can include multiple etching steps.

Figure 2X:
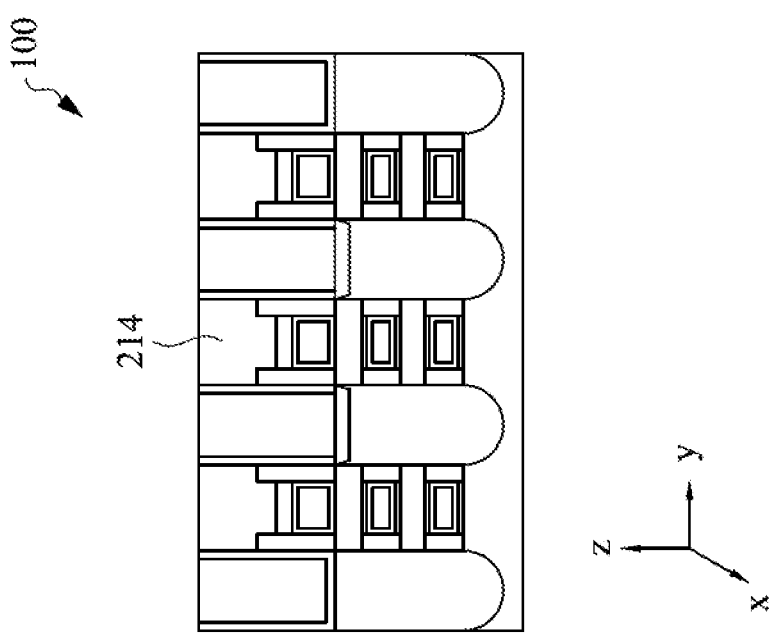

As shown in FIG. 2X, a first low-k dielectric layer 214 is formed in the openings 212. The first low-k dielectric layer 214 may be formed of any suitable material, and in some embodiments, the first low-k dielectric layer 214 is formed of one or more of silicon carbon nitride (SiCN), boron carbon nitride (BCN), hexagonal boron nitride (h-BN), amorphous boron nitride (a-BN), and hydrogenated amorphous carbon (a-C:H). In some embodiments, the first low-k dielectric layer 214 has a relative dielectric constant (k) that has a value of less than about 5. In some embodiments, the first low-k dielectric layer 214 has a relative dielectric constant (k) that is within a range from 2 to 5. In some embodiments, the first low-k dielectric layer 214 is an oxidation-free low-k dielectric layer. The first low-k dielectric layer 214 may be formed by any suitable process, including, for example, by deposition.

In some embodiments, an upper surface of the first low-k dielectric layer 214 may be substantially coplanar with upper surfaces of the source/drain contacts 210, the dielectric layer 160, and the dielectric layer 158, as shown. For example, a planarization process such as CMP may be performed after the formation of the first low-k dielectric layer 214. In some embodiments, the first low-k dielectric layer 214 serves as a CMP stop layer during the CMP, such that the upper surfaces of the semiconductor device 100 are planarized down to a level of an upper surface of the first low-k dielectric layer 214.

As shown in FIG. 2Y, a gate contact 216 is formed extending through the first low-k dielectric layer 214 overlying one or more of the gate structures. For example, the gate contact 216 may be formed on the uppermost gate electrode 108 of one or more of the gate structures, as shown. In some embodiments, a surface of the gate electrode 108 or the high-K gate dielectric layer 166 is exposed, for example, by selective removal of a portion of the first low-k dielectric layer 214. The gate contact 216 may be formed within an opening formed by the selective removal of the first low-k dielectric layer 214. The gate contact 216 may be formed by any suitable process, including, for example, by deposition. The gate contact 216 may be formed of any suitable conductive material, and in some embodiments, the gate contact 216 includes one or more of W, Ru, Co, Cu, Ti, TiN, Ta, TaN, Mo, or Ni.

In some embodiments, the source/drain contact 210 has a thickness or height 101 (e.g., measured along the Z-axis) that is less than 50 nm. In some embodiments, the source/drain contact 210 has a height 101 that is less than 40 nm. In some embodiments, the height 101 of the source/drain contact 210 is within a range from 15 nm to 40 nm.

In some embodiments, the first low-k dielectric layer 214 may be an oxidation-free low-k dielectric layer which can serve as an oxygen barrier to prevent or reduce a possible threshold voltage (Vt) shift due to the structure of the metal gate.

In some embodiments, the first low-k dielectric layer 214 has a width 103 (e.g., measured along the Y-axis) that is less than 50 nm. In some embodiments, the first low-k dielectric layer 214 has a width 103 that is less than 40 nm. In some embodiments, the width 103 of the first low-k dielectric layer 214 is within a range from 8 nm to 40 nm.

In some embodiments, a width 105 of a portion of the dielectric layer 160 overlying the source/drain region 110 (e.g., measured along the Y-axis) is less than 50 nm. In some embodiments, the width 105 is less than 40 nm. In some embodiments, the width 105 is within a range from 8 nm to 30 nm.

The semiconductor device 100 shown in FIG. 2Y illustrates the transistor 104 after processing of the transistor 104 is complete.

The gate all around transistor 104 functions by applying biasing voltages to the gate electrode 108 and to one or more of the source/drain contacts 210. The biasing voltages cause a channel current to flow through the semiconductor nanostructures 106 between the source/drain regions 110. Accordingly, the semiconductor nanostructures 106 correspond to a channel region of the gate all around transistor 104.

Figure 3:
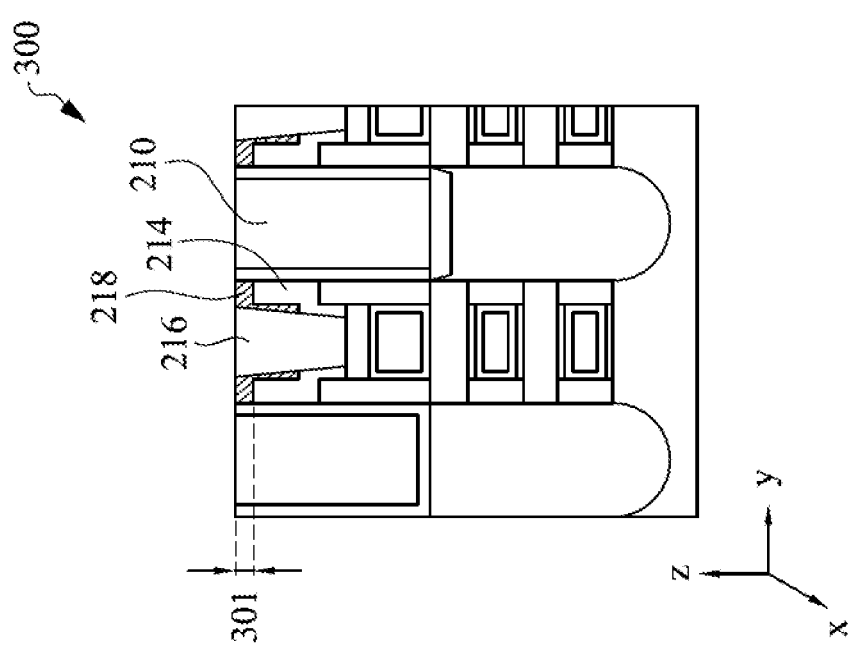
FIG. 3 is a cross-sectional view of a semiconductor device, in accordance with some embodiments.

FIG. 3 illustrates a semiconductor device 300 that may be formed by the same or substantially same processes illustrated with respect to FIGS. 2A through 2X. However, in contrast to the semiconductor device 100 shown in FIG. 2Y, the first low-k dielectric layer 214 is a thin layer or a liner of the first low-k dielectric material. For example, the first low-k dielectric layer 214 may be formed in the openings 212 (see FIG. 2W) by a deposition process, such as a conformal deposition process or the like, in which the first low-k dielectric layer 214 has a substantially same thickness lining the exposed surfaces in the openings 212. In some embodiments, the first low-k dielectric layer 214 may be formed by a deposition process and then portions of the first low-k dielectric layer 214 may be selectively removed, resulting in a liner of the first low-k dielectric layer 214 having a substantially same thickness.

A second low-k dielectric layer 218 may be formed on the first low-k dielectric layer 214, for example, in the openings 212. The second low-k dielectric layer 218 may be formed of any suitable material, and in some embodiments, the second low-k dielectric layer 214 is formed of one or more of SiCO, SiCON, SiO$_2$, SiOF, SiOH, SiOCH, HSQ, or MSQ. In some embodiments, the second low-k dielectric layer 218 has a relative dielectric constant (k) that has a value of less than about 5. In some embodiments, the second low-k dielectric layer 218 has a relative dielectric constant (k) that is within a range from 2 to 5. In some embodiments, the second low-k dielectric layer 218 is an oxidation-prone low-k dielectric layer. In some embodiments, the second low-k dielectric layer 218 is formed of a different material than the first low-k dielectric layer 214. The second low-k dielectric layer 218 may be formed by any suitable process, including, for example, by deposition.

The gate contact 216 of the semiconductor device 300 may be the same or substantially the same as described with respect to the semiconductor device 100 shown in FIG. 2Y. In some embodiments, the gate contact 216 is formed extending through the first low-k dielectric layer 214 and the second low-k dielectric layer 218 overlying one or more of the gate structures. For example, the gate contact 216 may be formed on the uppermost gate electrode 108 of one or more of the gate structures, as shown. In some embodiments, a surface of the gate electrode 108 or the high-K gate dielectric layer 166 is exposed, for example, by selective removal of portions of the first low-k dielectric layer 214 and the second low-k dielectric layer 218. The gate contact 216 may be formed within an opening formed by the selective removal of the first and second low-k dielectric layers 214, 218. The gate contact 216 may be formed by any suitable process, including, for example, by deposition. The gate contact 216 may be formed of any suitable conductive material, and in some embodiments, the gate contact 216 includes one or more of W, Ru, Co, Cu, Ti, TiN, Ta, TaN, Mo, or Ni. The gate contact 216 may contact side surfaces of each of the first and second low-k dielectric layers 214, 218, as shown.

In some embodiments, a thickness of the first low-k dielectric layer 214 may be less than 10 nm. In some embodiments, the thickness of the first low-k dielectric layer 214 is less than 5 nm. In some embodiments, a sidewall thickness of the first low-k dielectric layer 214 (e.g., a thickness of a sidewall portion of the first low-k dielectric layer 214 that is disposed on a side surface of the dielectric layer 158) is within a range from 0.1 nm to 5 nm.

As shown in FIG. 3, a portion of the second low-k dielectric layer 218 may be disposed on a top surface of the first low-k dielectric layer 214. The portion of the second low-k dielectric layer 218 disposed on the top surface of the first low-k dielectric layer 214 may have a height that is less than 5 nm. That is, a distance 301 between the upper surface of the first low-k dielectric layer 214 and the upper surface of the second low-k dielectric layer 218 may be less than 5 nm. In some embodiments, the distance 301 is within a range from 0.1 nm to 5 nm. In some embodiments, the second low-k dielectric layer 218 contacts the side surface of the dielectric layer 158 along the entire distance 301 between the upper surface of the first low-k dielectric layer 214 and the upper surface of the second low-k dielectric layer 218.

Figure 4:
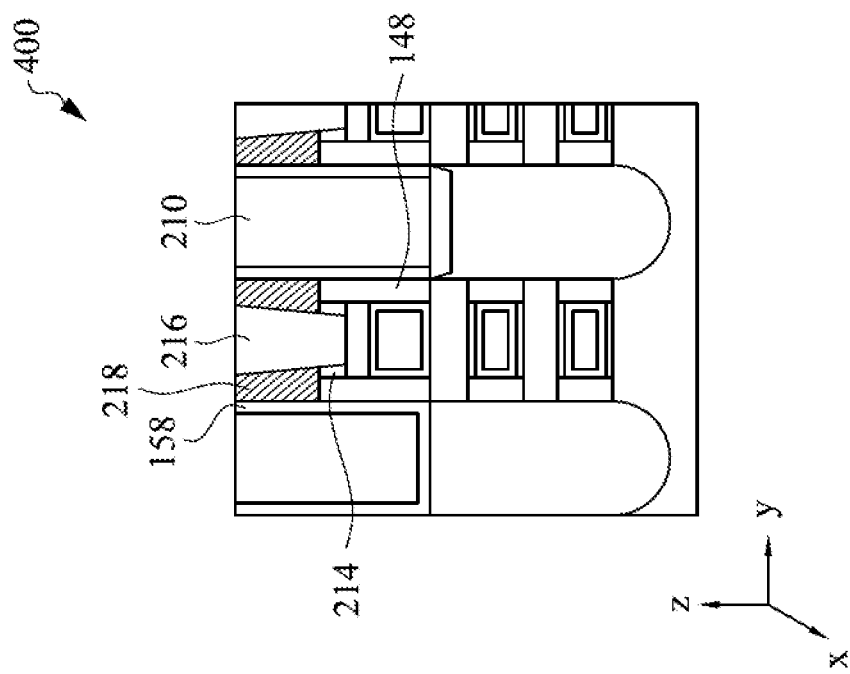
FIG. 4 is a cross-sectional view of a semiconductor device, in accordance with some embodiments.

FIG. 4 illustrates a semiconductor device 400 that may be formed by the same or substantially same processes illustrated with respect to FIGS. 2A through 2X. However, in contrast to the semiconductor device 100 shown in FIG. 2Y, the first low-k dielectric layer 214 is a thin layer that does not extend over upper surfaces of the gate spacer layer 148 and does not contact side surfaces of the dielectric layer 158. For example, the first low-k dielectric layer 214 may be formed in the openings 212 (see FIG. 2W) by a deposition process in which the first low-k dielectric layer 214 is formed only on the gate electrode 108 or the high-K gate dielectric layer 166 and on side surfaces of the gate spacer layer 148 exposed in the openings 212. The first low-k dielectric layer 214 may have a thickness that is less than 10 nm. In some embodiments, the first low-k dielectric layer 214 may have a thickness that is within a range from 1 nm to 5 nm. In some embodiments, the first low-k dielectric layer 214 may be formed by a deposition process and then portions of the first low-k dielectric layer 214 may be selectively removed, resulting in a liner of the first low-k dielectric layer 214 that is disposed only on the gate electrode 108 or the high-K gate dielectric layer 166 and on side surfaces of the gate spacer layer 148 exposed in the openings 212.

The second low-k dielectric layer 218 may be formed on the first low-k dielectric layer 214, for example, in the openings 212. The gate contact 216 of the semiconductor device 400 may be the same or substantially the same as described with respect to the semiconductor device 100 shown in FIG. 2Y and the semiconductor device 300 shown in FIG. 3. In some embodiments, the gate contact 216 is formed extending through the first low-k dielectric layer 214 and the second low-k dielectric layer 218 overlying one or more of the gate structures. For example, the gate contact 216 may be formed on the uppermost gate electrode 108 of one or more of the gate structures, as shown. In some embodiments, a surface of the gate electrode 108 or the high-K gate dielectric layer 166 is exposed, for example, by selective removal of portions of the first low-k dielectric layer 214 and the second low-k dielectric layer 218. The gate contact 216 may be formed within an opening formed by the selective removal of the first and second low-k dielectric layers 214, 218. The gate contact 216 may be formed by any suitable process, including, for example, by deposition.

FIGS. 5A through 5F are cross-sectional views of a semiconductor device 500 at various stages of processing, according to some embodiments. The processes illustrated in FIGS. 5A through 5F may be performed subsequent to the processes illustrated in FIGS. 2A through 2Q, in some embodiments.

Figure 5B:
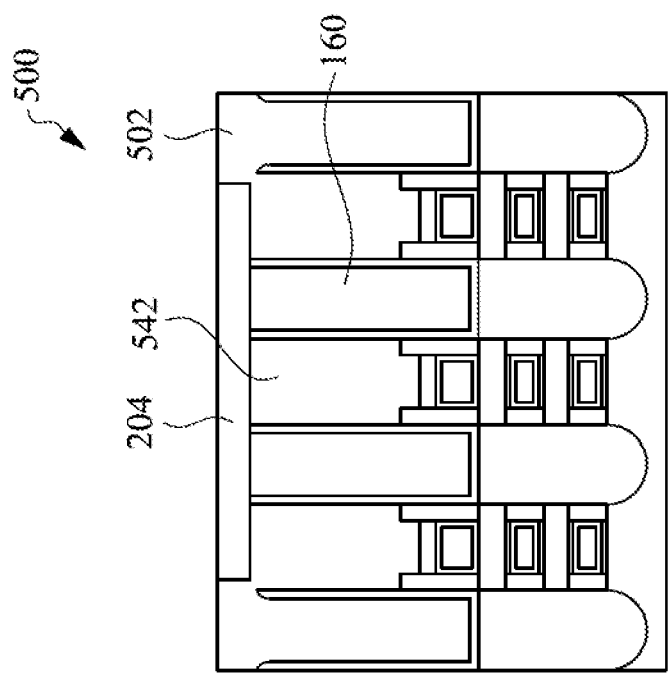
FIGS. 5A through 5F are cross-sectional views of a semiconductor device at various stages of processing, according to some embodiments.
Figure 5A:
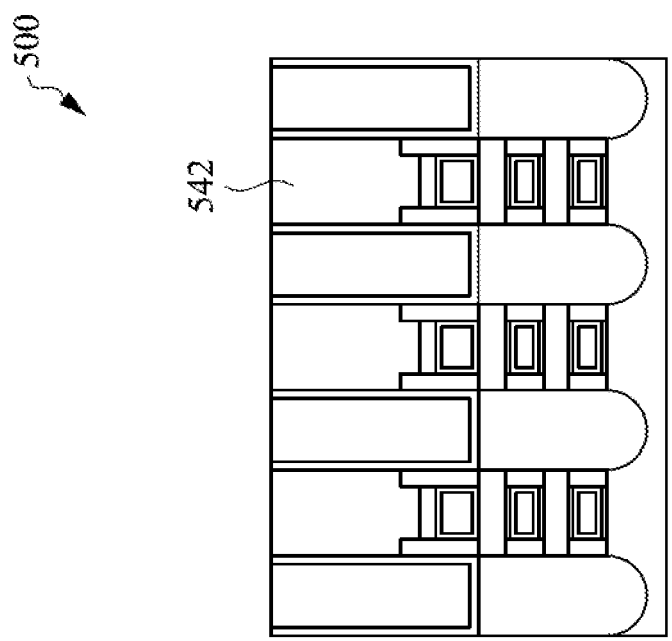

As shown in FIG. 5A, the semiconductor device 500 may be formed by substantially the same processes described with respect to the semiconductor device 100 shown in FIG. 2R. However, in the semiconductor device 500 of FIG. 5A, a first low-k dielectric layer 542 is formed instead of the gate dummy contacts 242 of the semiconductor device 100 of FIG. 2R. The first low-k dielectric layer 542 may be formed of any suitable low-k dielectric layer material. In some embodiments, the first low-k dielectric layer 542 may be formed of a same material as the first low-k dielectric layer 214 previously described herein. For example, the first low-k dielectric layer 542 may be formed of one or more of silicon carbon nitride (SiCN), boron carbon nitride (BCN), hexagonal boron nitride (h-BN), amorphous boron nitride (a-BN), and hydrogenated amorphous carbon (a-C:H). In some embodiments, the first low-k dielectric layer 542 may be formed of a same material as the second low-k dielectric layer 218 previously described herein. For example, first the low-k dielectric layer 542 may be formed of one or more of SiCO, SiCON, $SiO_2$, SiOF, SiOH, SiOCH, HSQ, or MSQ. In some embodiments, the first low-k dielectric layer 542 may be formed of any combination of the materials of the first or second low-k dielectric layers 214, 218 previously described herein.

In some embodiments, the first low-k dielectric layer 542 has a relative dielectric constant (k) that has a value of less than about 5. In some embodiments, the first low-k dielectric layer 542 has a relative dielectric constant (k) that is within a range from 2 to 5. In some embodiments, the first low-k dielectric layer 542 is an oxidation-free low-k dielectric layer or an oxidation-prone low-k dielectric layer. The first low-k dielectric layer 542 may be formed by any suitable process, including, for example, by deposition.

As shown in FIG. 5B, portions of the dielectric layer 160 overlying one or more of the source/drain regions 110 may be selectively removed, for example, by etching, and a contact end cut (CMD) layer 502 may be selectively formed in the recesses resulting from the removal of the portions of the dielectric layer 160. For example, as shown in FIG. 5B, the CMD layer 502 may be formed overlying the source/drain regions 110 at the left and right sides of the semiconductor device 500. The CMD layer 502 may extend to a height that is greater than a height of the upper surface of the first low-k dielectric layer 542. The CMD layer 502 may be formed by any suitable technique, including, for example, by deposition of the material forming the CMD layer 502. The CMD layer 502 may be formed of any suitable material, which in some embodiments may include a same material as the first low-k dielectric layer 542.

Figure 5D:
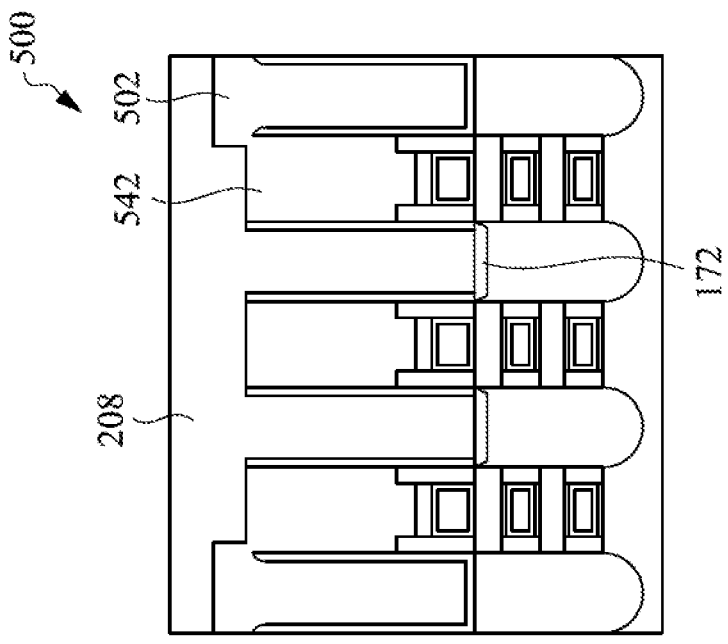
Figure 5C:
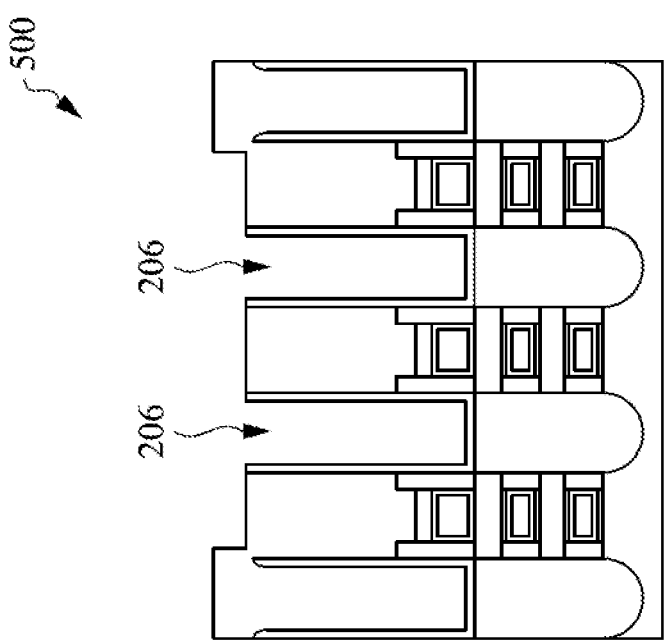

In some embodiments, a dielectric layer 204 may be formed on upper surfaces of the first low-k dielectric layer 542, the dielectric layer 160, and the dielectric layer 158, and the dielectric layer 204 may extend laterally between portions of the CMD layer 502, as shown in FIG. 5C. The dielectric layer 204 may be formed by any suitable technique, including, for example, by deposition.

As shown in FIG. 5C, the dielectric layer 204 and portions of the dielectric layer 160 and the dielectric layer 158 are removed. The layers may be removed by any suitable process. For example, in some embodiments, an etching process may be performed to remove the dielectric layer 204 and the portions of the dielectric layer 160 and the dielectric layer 158. The etching process can be performed in one or more steps. The one or more steps selectively etch the dielectric layer 204 and portions of the dielectric layer 160 and the dielectric layer 158 with respect to the materials of the first low-k dielectric layer 542, the CMD layer 502, and the dielectric layer 158. Accordingly, as shown in FIG. 5C, openings 206 are formed overlying one or more of the source/drain regions 110. The one or more etching steps can include wet etches, dry etches, timed etches, or other types of etching processes. In some embodiments, the etching includes an isotropic etching process.

The process illustrated with respect to FIG. 5C may be the same or substantially the same as described previously herein with respect to FIG. 2T.

As shown in FIG. 5D, a silicide 172 is formed on the source/drain regions 110 that were exposed in the openings 206 and the conductive layer 208 is formed in the openings 205 and on upper surfaces of the first low-k dielectric layer 542 and the CMD layer 502. The process illustrated with respect to FIG. 5D may be the same or substantially the same as described previously herein with respect to FIG. 2U.

Figure 5F:
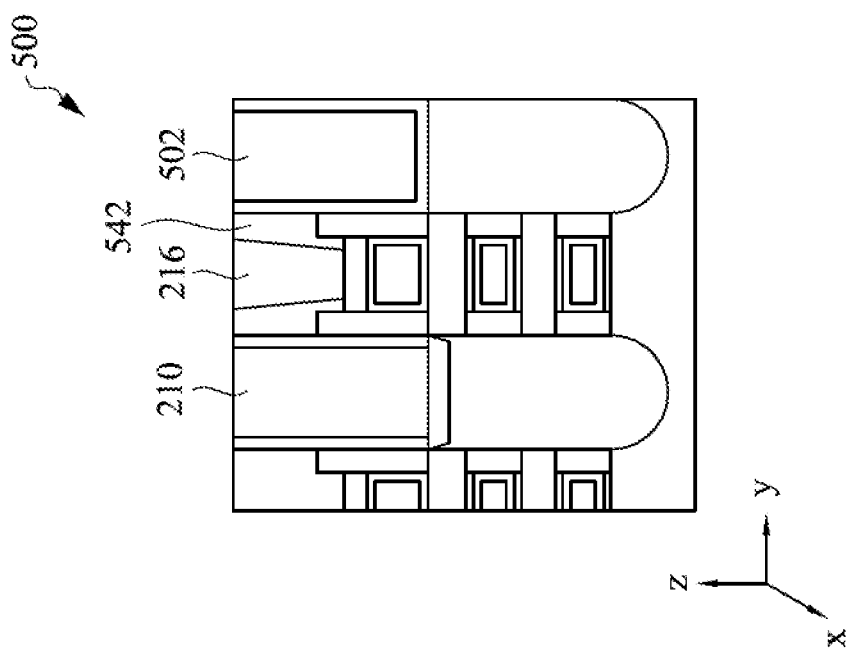
Figure 5E:
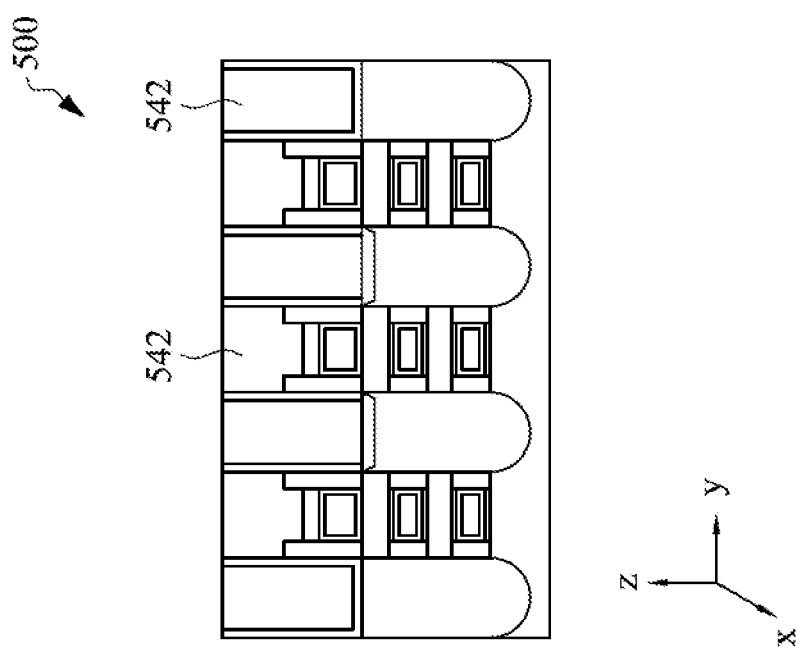

As shown in FIG. 5E, the semiconductor device 500 is planarized, for example by CMP, resulting in a planarized upper surface. The process illustrated with respect to FIG. 5E may be the same or substantially the same as described previously herein with respect to FIG. 2V. However, since the first low-k dielectric layer 542 was formed directly on the gate structures (as described with respect to FIG. 5A) instead of the gate dummy contacts 242 of the semiconductor device 100 of FIG. 2R, the semiconductor device 500 resulting from the process shown in FIG. 5E is substantially the same as the semiconductor device 100 resulting from the process of FIG. 2X. One difference is that the CMD layer 502 remains overlying one or more of the source/drain regions 110 in the semiconductor device 500, instead of the dielectric layer 160 overlying the source/drain regions 110 in the semiconductor device 100.

As shown in FIG. 5F, a gate contact 216 is formed extending through the first low-k dielectric layer 542 overlying one or more of the gate structures. The gate contact 216 may be the same or substantially the same as previously described herein with respect to FIG. 2Y.

The semiconductor device 500 shown in FIG. 5F is substantially the same as the semiconductor device 100 shown in FIG. 2Y, except that the gate electrode 216 is positioned laterally between the source/drain contact 210 and the CMD layer 502 in the semiconductor device 500, whereas the gate electrode 216 is positioned laterally between the source/drain contact 210 and the dielectric layer 160 in the semiconductor device 100.

Figure 6:
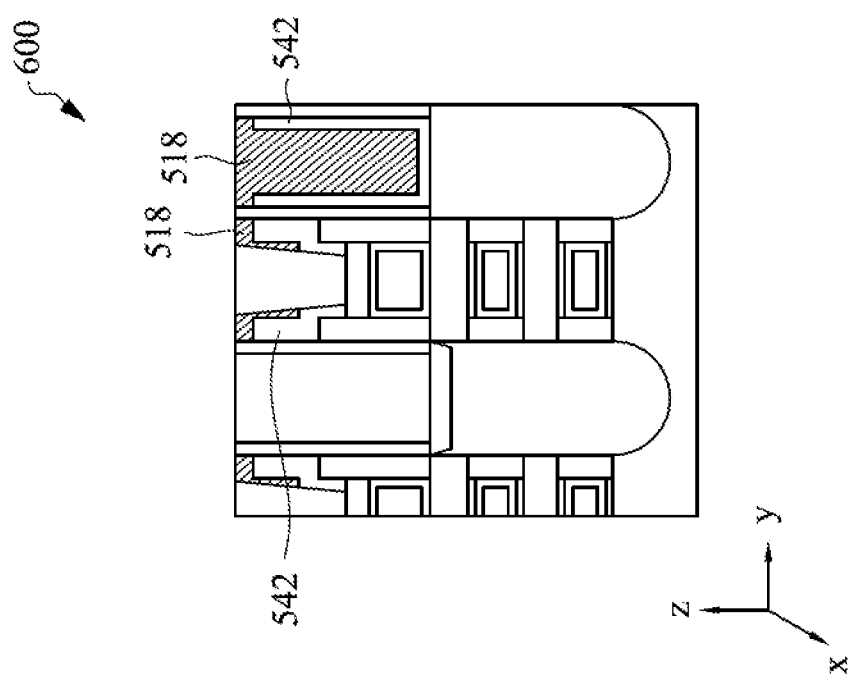
FIG. 6 is a cross-sectional view of a semiconductor device, in accordance with some embodiments.

FIG. 6 illustrates a semiconductor device 600 that may be formed by the same or substantially same processes illustrated with respect to FIGS. 5A through 5F. However, in contrast to the semiconductor device 500 shown in FIG. 5F, the first low-k dielectric layer 542 is a thin layer or a liner of the first low-k dielectric material. For example, the first low-k dielectric layer 542 may be formed by a deposition process, such as a conformal deposition process or the like, in which the first low-k dielectric layer 542 has a substantially same thickness. In some embodiments, the first low-k dielectric layer 542 may be formed by a deposition process and then portions of the first low-k dielectric layer 542 may be selectively removed, resulting in a liner of the first low-k dielectric layer 542 having a substantially same thickness.

A second low-k dielectric layer 518 may be formed on the first low-k dielectric layer 542. The second low-k dielectric layer 518 may be the same or substantially the same as the second low-k dielectric layer 218 previously described herein with respect to FIG. 3. For example, the second low-k dielectric layer 518 may be formed of one or more of SiCO, SiCON, $SiO_2$, SiOF, SiOH, SiOCH, HSQ, or MSQ. In some embodiments, the second low-k dielectric layer 518 is formed of a different material than the first low-k dielectric layer 542. The second low-k dielectric layer 518 may be formed by any suitable process, including, for example, by deposition.

The gate contact 216 of the semiconductor device 500 may be the same or substantially same as described with respect to the semiconductor device 300 shown in FIG. 3. In some embodiments, the gate contact 216 is formed extending through the first low-k dielectric layer 542 and the second low-k dielectric layer 518 overlying one or more of the gate structures.

In some embodiments, a thickness of the first low-k dielectric layer 542 may be less than 10 nm. In some embodiments, the thickness of the first low-k dielectric layer 542 is less than 5 nm. In some embodiments, a sidewall thickness of the first low-k dielectric layer 542 (e.g., a thickness of a sidewall portion of the first low-k dielectric layer 542 that is disposed on a side surface of the dielectric layer 158) is within a range from 0.1 nm to 5 nm.

As shown in FIG. 6, a portion of the second low-k dielectric layer 518 may be disposed on a top surface of the first low-k dielectric layer 542. The portion of the second low-k dielectric layer 518 disposed on the top surface of the first low-k dielectric layer 542 may have a height that is the same or substantially the height of the corresponding portion of the low-k dielectric layer 218 as previously described herein with respect to FIG. 3.

Figure 7:
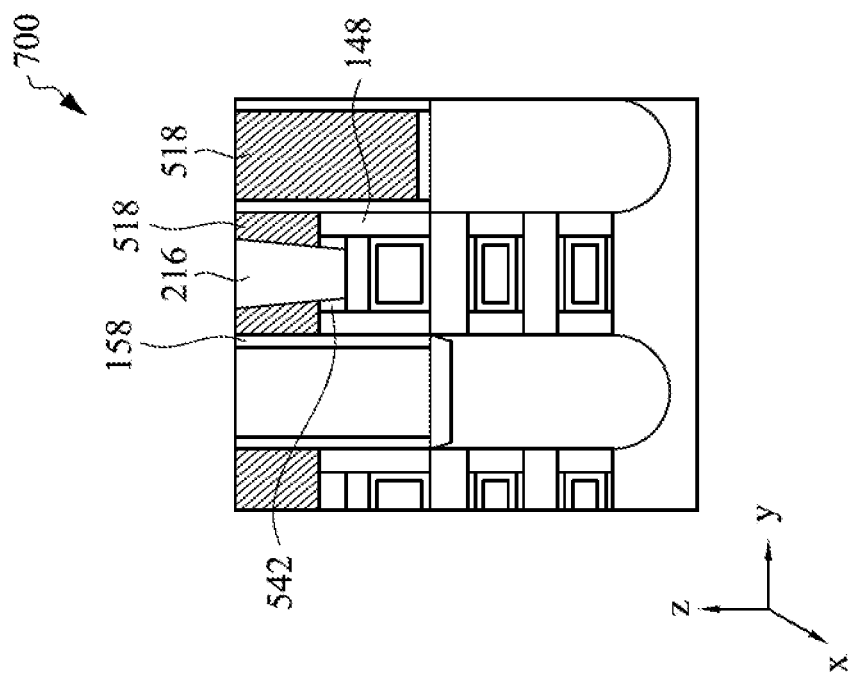
FIG. 7 is a cross-sectional view of a semiconductor device, in accordance with some embodiments.

FIG. 7 illustrates a semiconductor device 700 that may be formed by the same or substantially same processes illustrated with respect to FIGS. 5A through 5F. However, in contrast to the semiconductor device 500 shown in FIG. 5F, the first low-k dielectric layer 542 is a thin layer that does not extend over upper surfaces of the gate spacer layer 148 and does not contact side surfaces of the dielectric layer 158. For example, the first low-k dielectric layer 542 may be formed by a deposition process in which the first low-k dielectric layer 542 is formed only on the gate electrode 108 or the high-K gate dielectric layer 166 and on side surfaces of the gate spacer layer 148. The first low-k dielectric layer 542 may have a thickness that is less than 10 nm. In some embodiments, the first low-k dielectric layer 542 may have a thickness that is within a range from 1 nm to 5 nm. In some embodiments, the first low-k dielectric layer 542 may be formed by a deposition process and then portions of the first low-k dielectric layer 542 may be selectively removed, resulting in a liner of the first low-k dielectric layer 542 that is disposed only on the gate electrode 108 or the high-K gate dielectric layer 166 and on side surfaces of the gate spacer layer 148.

The second low-k dielectric layer 518 may be formed on the first low-k dielectric layer 542. The gate contact 216 of the semiconductor device 700 may be the same or substantially the same as described with respect to the semiconductor device 400 shown in FIG. 4.

As described herein, embodiments of the present disclosure provide a semiconductor device having improved performance due at least in part to the presence of one or more low-k dielectric layers which reduces a capacitance between a gate contact and a source/drain contact. The one or more low-k dielectric layers act as a liner or body that is disposed laterally between the gate contact and the source/drain contact. Embodiments of this disclosure thus facilitate a reduction in a distance between the gate and source/drain contacts, as the reduced capacitance allows for good operation of the semiconductor device without failure due to capacitance between the gate and source/drain contacts that would otherwise exist without the presence of the low-k dielectric layers. Additionally, in some embodiments of the present disclosure, a process of forming the semiconductor device is provided that includes an isotropic etching step which facilitates formation of the device including the low-k dielectric layers with reduced complexity and number of processing steps.

In one or more embodiments, a device includes a substrate. A channel region of a transistor overlies the substrate and a source/drain region is in contact with the channel region. The source/drain region is adjacent to the channel region along a first direction. A source/drain contact is disposed on the source/drain region. A gate electrode is disposed on the channel region and a gate contact is disposed on the gate electrode. A first low-k dielectric layer is disposed between the gate contact and the source/drain contact along the first direction.

In one or more embodiments, a method includes forming a channel region of a transistor. A source/drain region is formed in contact with the channel region, with the source/drain region adjacent to the channel region along a first direction. A source/drain contact is formed on the source/drain region, and a gate electrode is formed on the channel region. A gate contact is formed on the gate electrode. A first low-k dielectric layer is formed between the gate contact and the source/drain contact along the first direction.

In one or more embodiments, a device includes a substrate and a channel region of transistor overlying the substrate. A first source/drain region is in contact with a first side of the channel region. A second source/drain region is in contact with a second side of the channel region that is opposite the first side. A source/drain contact is on the first source/drain region, a gate electrode is on the channel region, and a gate contact is on the gate electrode. A contact end cut (CMD) layer is on the second source/drain region. A first low-k dielectric layer is disposed between the gate contact and the source/drain contact, and between the gate contact and the CMD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a channel region of a transistor overlying the substrate;
   a source/drain region in contact with the channel region, the source/drain region adjacent to the channel region along a first direction;
   a source/drain contact on the source/drain region;
   a dielectric liner layer lining a sidewall of the source/drain contact;
   a gate electrode on the channel region;
   a gate dielectric layer on the gate electrode;
   a gate contact on the gate electrode;
   a gate spacer dielectric layer between the gate electrode and the dielectric liner layer; and
   a first dielectric layer in contact with a top surface of the gate spacer dielectric layer, in contact with the dielectric liner layer above the gate spacer dielectric layer, and in contact with a sidewall of the gate contact.

2. The device of claim 1, wherein the channel region includes a plurality of semiconductor nanostructures.

3. The semiconductor device of claim 1, further comprising a silicide layer between the source/drain region and the source/drain contact.

4. The semiconductor device of claim 1, wherein the first dielectric layer has a dielectric constant less than 5.

5. The semiconductor device of claim 1, further comprising:
   a second dielectric layer on the first dielectric layer and disposed between the gate contact and the source/drain contact along the first direction, wherein the second dielectric layer has a dielectric constant less than 5.

6. The semiconductor device of claim 5, wherein the first dielectric layer includes at least one of the group of SiCN, BCN, h-BN, a-BN, and z-C:H, and
   wherein the second dielectric layer includes at least one of the group of SiCO, SiCON, $SiO_2$, SiOF, SiOH, SiOCH, HSQ, and MSQ.

7. The semiconductor device of claim 5, wherein a distance between an upper surface of the first dielectric layer and an upper surface of the second dielectric layer is less than 5 nm.

8. The semiconductor device of claim 5, wherein the gate spacer dielectric layer is positioned between the gate dielectric layer and the source/drain contact.

9. The semiconductor device of claim 8, wherein the second dielectric layer is spaced apart from the gate spacer layer by the first dielectric layer.

10. The semiconductor device of claim 8, wherein the second dielectric layer contacts the dielectric liner layer above the first dielectric layer.

11. The semiconductor device of claim 8, wherein the dielectric linear layer has a thickness along the first direction that is within a range from 1 nm to 5 nm.

12. The semiconductor device of claim 5, wherein the second dielectric layer has a thickness along the first direction that is within a range from 0.1 nm to 5 nm.

13. A method, comprising:
    forming a channel region of a transistor;
    forming a source/drain region in contact with the channel region, the source/drain region adjacent to the channel region along a first direction;
    forming a source/drain contact on the source/drain region;
    forming a dielectric liner layer lining a sidewall of the source/drain contact;
    forming a gate electrode on the channel region;
    forming a gate dielectric layer on the gate electrode;
    forming a gate spacer dielectric layer between the gate electrode and the dielectric liner layer;
    forming a gate contact on the gate electrode; and
    forming a first dielectric layer in contact with a top surface of the gate spacer dielectric layer, in contact with the dielectric liner layer above the gate spacer dielectric layer, and in contact with a sidewall of the gate contact.

14. The method of claim 13, wherein the forming the source/drain electrode includes forming an opening by performing an isotropic etch to remove a portion of an interlevel dielectric layer overlying the source/drain region, and wherein the forming the source/drain contact includes forming the source/drain contact in the opening.

15. The method of claim 13, further comprising forming a silicide layer between the source/drain region and the source/drain contact.

16. The method of claim 13, further comprising forming a second dielectric layer on the first dielectric layer, the second dielectric layer disposed between the gate contact and the source/drain contact along the first direction.

17. A device, comprising:
    a substrate;
    a channel region of a transistor overlying the substrate;
    a first source/drain region in contact with a first side of the channel region;
    a second source/drain region in contact with a second side of the channel region that is opposite the first side;
    a source/drain contact on the first source/drain region;
    a dielectric liner layer lining a sidewall of the source/drain contact;
    a gate electrode on the channel region;
    a gate spacer layer dielectric layer between the gate electrode and the dielectric liner layer;
    a gate contact on the gate electrode;
    a first dielectric layer in contact with a top surface of the gate spacer dielectric layer, in contact with the dielectric liner layer above the gate spacer dielectric layer, and in contact with a sidewall of the gate contact.

18. The device of claim 17, further comprising a second dielectric layer on the first dielectric layer, the second dielectric layer disposed between the gate contact and the dielectric liner layer.

19. The device of claim 18, wherein the first dielectric layer includes at least one of the group of SiCN, BCN, h-BN, a-BN, and a-C:H; and
    wherein the second dielectric layer includes at least one of the group of SiCO, SiCON, $SiO_2$, SiOF, SiOH, SiOCH, HSQ, and MSQ.

20. The device of claim 17, wherein the second dielectric layer is in contact with the dielectric liner layer above the first dielectric layer.

* * * * *